(12) United States Patent
Wang

(10) Patent No.: US 12,211,573 B2
(45) Date of Patent: Jan. 28, 2025

(54) BURST INDICATOR SYSTEMS AND METHODS

(71) Applicant: Micron Technology, Inc., Boise, ID (US)

(72) Inventor: Kai Wang, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 316 days.

(21) Appl. No.: 17/725,025

(22) Filed: Apr. 20, 2022

(65) Prior Publication Data

US 2023/0343407 A1    Oct. 26, 2023

(51) Int. Cl.
*G11C 29/12* (2006.01)
*G11C 29/18* (2006.01)
*G11C 29/36* (2006.01)
*G11C 29/46* (2006.01)
*G11C 29/56* (2006.01)

(52) U.S. Cl.
CPC ........ *G11C 29/36* (2013.01); *G11C 29/12005* (2013.01); *G11C 29/1201* (2013.01); *G11C 29/18* (2013.01); *G11C 29/46* (2013.01); *G11C 29/56* (2013.01); *G11C 2029/3602* (2013.01); *G11C 2029/5602* (2013.01)

(58) Field of Classification Search
CPC .............. G11C 29/36; G11C 29/12005; G11C 29/1201; G11C 29/18; G11C 29/46; G11C 29/56; G11C 2029/3602; G11C 2029/5602; G11C 7/1018; G11C 29/50012; G11C 29/028
See application file for complete search history.

(56) References Cited

U.S. PATENT DOCUMENTS

| | | | | |
|---|---|---|---|---|
| 2011/0211411 A1* | 9/2011 | Ide | ............ | G11C 8/06 365/219 |
| 2014/0010034 A1* | 1/2014 | Ide | ........ | G11C 11/4087 365/230.06 |
| 2014/0192583 A1* | 7/2014 | Rajan | ........ | G11C 7/10 365/63 |
| 2020/0075567 A1* | 3/2020 | Collins | ........ | H01L 21/4857 |

OTHER PUBLICATIONS

"LPDDR"; Wikipedia; https://en.wikipedia.org/wiki/LPDDR; last accessed Feb. 10, 2022; 11 pages.
"Memory rank"; Wikipedia; https://en.wikipedia.org/wiki/Memory_rank; last accessed Feb. 10, 2022; 2 pages.
Schweber, Bill; "The Buffer/Driver: What Is It, and Do I Need One?"; Embedded Computing Design; Jan. 14, 2020; 4 pages.
Keysight Technologies; Infiniium V-Series Oscilloscopes—Data Sheet; Jul. 17, 2017; 47 pages.

* cited by examiner

*Primary Examiner* — Mohammed A Bashar
(74) *Attorney, Agent, or Firm* — Fletcher Yoder, P.C.

(57) ABSTRACT

Systems and methods for filtering data (DQ) signals are described herein. The systems and methods may involve operating a memory to enter a training mode and sending a command to a decoder while the memory is in the training mode. The decoder may generate a command/address waveform in response to the command. The systems and methods may involve transmitting a burst indicator waveform via a first pin of the memory. The burst indicator waveform may be generated by a burst indicator generator of the memory based on the command/address waveform.

20 Claims, 11 Drawing Sheets

Case 1: Mixed Eye Diagrams of Two Ranks

Case 2: Mixed Eye Diagrams of Normal Writes and MPC-WR FIFO Operations

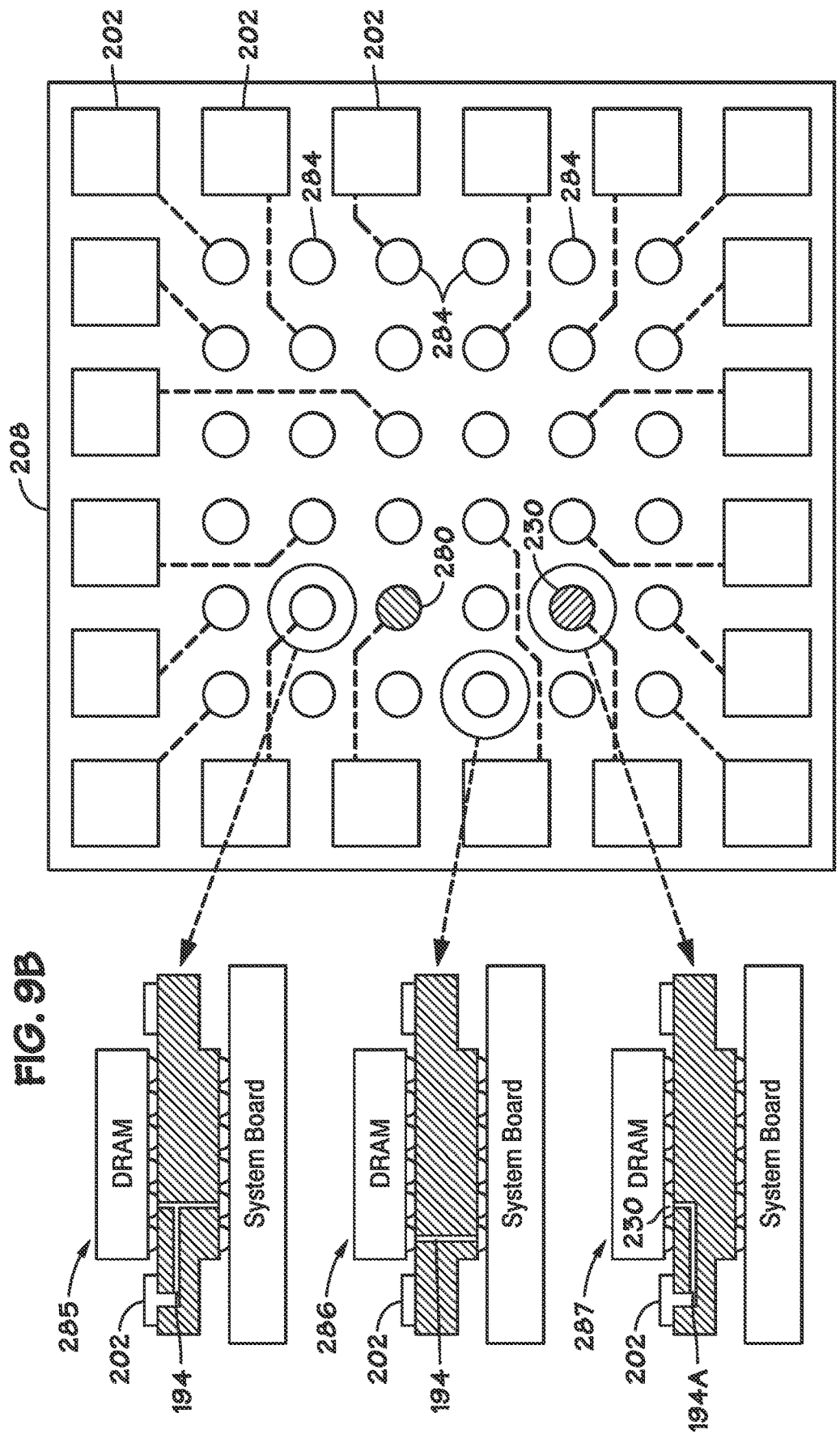

BURST INDICATOR SYSTEMS AND METHODS

BACKGROUND

Field of the Present Disclosure

Embodiments of the present disclosure relate generally to the field of semiconductor devices. More specifically, embodiments of the present disclosure relate to validation of memory timing of a semiconductor device.

Description of Related Art

A semiconductor device, such as a microcomputer, memory, gate array, among others, may include input/output (IO) pins and an output circuit for transmitting data to other devices, via a bus, transmission lines formed on a board, and the like. The semiconductor device may include a circuit that controls transmitting the data and may include, for example, output buffers and drivers. To consistently and accurately transmit data, timing of signals transmitted and/or handled by the semiconductor device may be designed to comply with industry specifications or other desired operational parameters.

A semiconductor device may use or be used to perform a timing validation operation to characterize timing of data transmitted within the semiconductor device. For example, the timing validation operation may characterize a timing margin of a read and/or write burst associated with the semiconductor device. However, when doing so, it may be difficult to filter out the target waveforms to perform the timing validation operation. For example, eye diagrams may be undesirably overlapping or mixed with ongoing operations overlapping with the timing validation operation. Errors that result from uncorrected timing may cause additional distortions to final data, thus reducing the reliability of data transmitted within the semiconductor memory devices.

Accordingly, embodiments of the present disclosure may be directed to one or more of the problems set forth above.

BRIEF DESCRIPTION OF DRAWINGS

FIG. 9B is a block diagram of a top view of a portion of the system of FIG. 9A with example couplings associated with conductive package balls, in accordance with an embodiment of the present disclosure;

DETAILED DESCRIPTION

Figure 1:
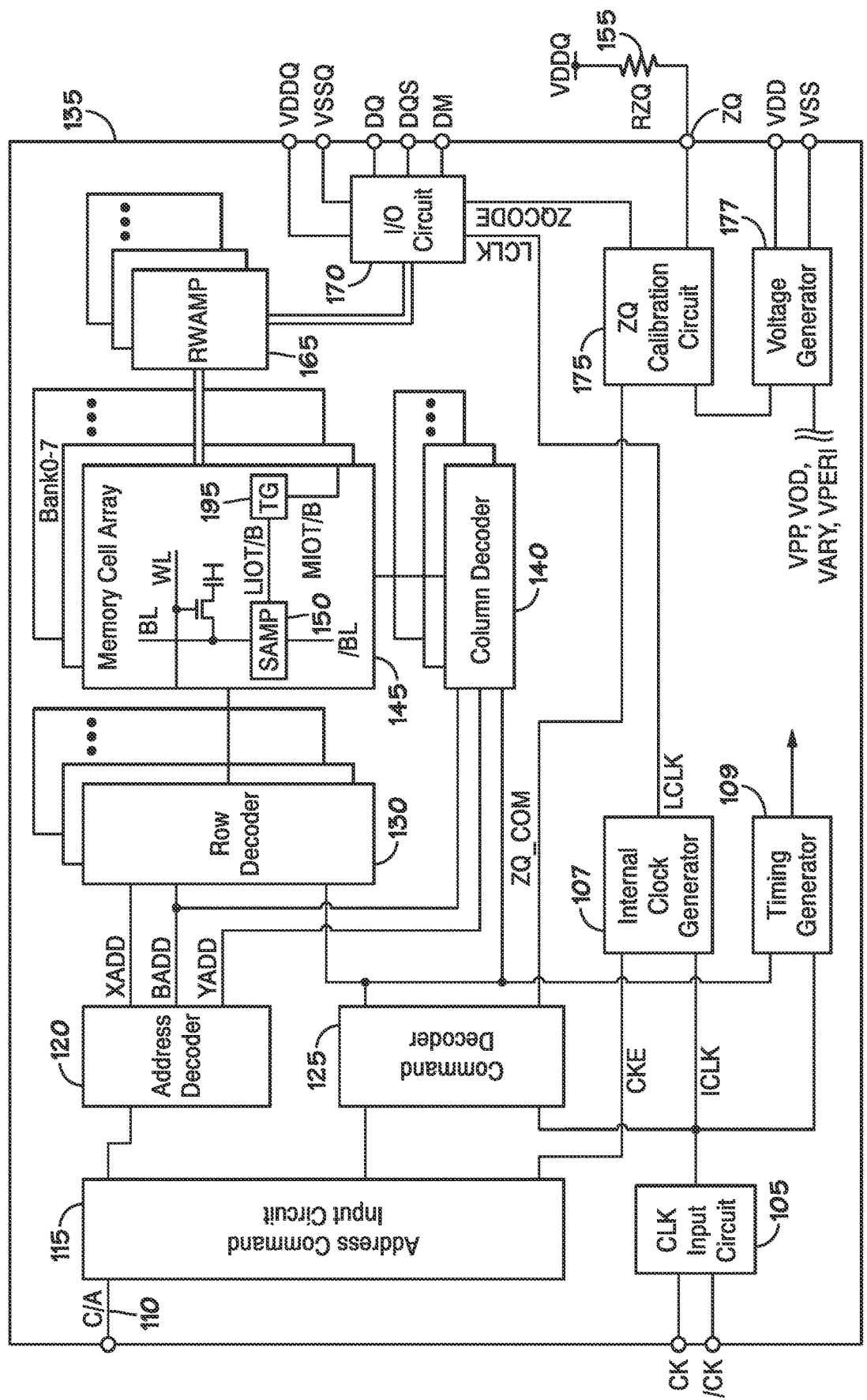
FIG. 1 is a schematic block diagram of a semiconductor memory device, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Semiconductor devices, such as memory devices, may communicate with external components, such as when the semiconductor devices are a part of a larger system. These communications may occur according to timing specified in a target specification, like a target specification defined by an enterprise specification, a manufacturer specification, an industry specification, or the like. For example, the Joint Electron Device Engineering Council (JEDEC) standard defines timings and signals of read bursts and write bursts used when accessing memory. The semiconductor devices operating in violation of the target specification timing may cause data or operational errors since downstream or upstream components of the memory may operate according to the target specification timing.

Read bursts and/or write bursts may be referred to generally herein as command bursts. Timing of a memory device may be validated by analyzing timing of data corresponding to a command burst associated with the memory device. The data corresponding to a command burst may be sensed and represented by an eye diagram, which may illustrate rising and falling edges of the data. Comparing timing of the eye diagram of the command burst to desired timing may help determine whether the memory device operates as desired, such as in accordance with target specification timing. Indeed, when the timing of an actual eye diagram is a non-negligible amount of time different from the desired timing, the memory device may be thought of as "out of spec" or as not operating as desired. For example, a special board (e.g., an interposer) with test pads may be assembled between memory and a system board. An oscilloscope may couple via probes to the test pads to measure the signals under test, like data (DQ) signals from the memory and corresponding clock signals (DQS) used to sample the DQ signals. The oscilloscope may include circuitry to filter specific waveforms from the measured signals based on which eye diagram is to be generated from the measured DQ signals. Sometimes, the oscilloscope is unable to precisely filter out the specific waveforms, which may complicate the validation of the memory device timing or make it commercially infeasible.

There are at least two cases in which the oscilloscope may capture an inaccurate eye diagram of a data burst. A first case may occur with a dual-rank memory system, like a dual-rank double data rate (DDR) system. A memory rank may include one or more memory chips, like one or more dynamic random access memory (DRAM) chips, each connected in a manner that enables the one or more memory chips of the memory rank to receive a chip select signal, and thus the one or more memory chips of the rank is simultaneously accessed. A dual rank memory system may include two memory ranks on a same memory module, where each memory rank is accessed using different chip select signals but otherwise simultaneously receives other command and control signals. Despite being on the same memory module, each memory rank may have its own timing characteristics and thus may be separately validated. Thus, it may be desired to isolate data (DQ) bursts corresponding to a training command (MPC). However, when measured via an oscilloscope, resulting waveforms for a read training command (MPC-RD) and/or a write training command (MPC-WR) (or any subset of data-related access commands) may blend together in an eye diagram, making it difficult to filter and validate the timing of the data separately for the two memory ranks.

A second case may involve a special command waveform itself implying undesired timing as opposed to a training burst. To elaborate, the memory system controller deploying a periodic training to periodically compensate a potential timing drift based on iterative adjustments and testing, where the potential timing drift may be caused by variation of environment conditions (e.g., temperature changes, voltage changes). In this second case, DQ bursts corresponding to a training command may be masked to leave DQ bursts corresponding to normal commands also issued in this training mode. Thus, a final eye diagram may be desired to be based on the DQ bursts resulting from the normal commands. During this training mode, the memory controller may not service the normal access requests to help reduce functional errors from occurring, such as normal access requests issued from upper layer masters such as central processing unit (CPU) core, a graphics processing unit (GPU) core in a system-on-chip (SOC) processor, or the like. Furthermore, during this training mode, the memory controller itself may initiate one or more special training read/write accesses (e.g., through special read training commands (MPC-RD), through special write training commands (MPC-WR)) to train the timing. The training commands generate similar read/write bursts as normal read/write commands, and the difference between the training commands and the normal commands being that the training commands are kept from touching the data contents stored in a memory array of the memory system (e.g., a dynamic random-access memory (DRAM) memory array). During the training mode, there may be "outliers" in the resulting eye diagram. However, based on a given measured eye diagram, it may be difficult or impossible to determine whether a discrete curve is a real timing violation of a normal burst or a special training burst.

In either of these cases, an accurate eye diagram may be complex (or otherwise unable) to generate based on read bursts and/or write bursts, which may leave timing unable to be validated and/or an oscilloscope filtering function may be unable to differentiate a resulting burst from a training command or a normal command. Potential workarounds may include activating one rank at a time or to disable periodic training functions, but these solutions may be undesirable as they may rely on vendor or customer assistance to do so. In addition, these workarounds may be unable to precisely reflect the real application scenario because the workarounds may require changing the hardware configuration or software behavior of the memory system. Thus, a memory system-based solution may be desired.

Keeping the foregoing in mind, systems and methods are described herein that use a burst indicator generator implemented in the memory system. Indeed, the burst indicator generator may enable differentiation between the real timing violation of a normal burst or a special training burst, thereby improve training methods (e.g., validation operations). Using the burst indicator generator to isolate a type of a command burst waveform may improve accuracy of eye diagrams corresponding to DQ signals generated via the command burst waveform without additional vendor or customer assistance.

To elaborate, the burst indicator generator may indicate a type of a command burst using a separate waveform from the actual command burst waveform. In this way, the indicator may indicate what command the DQ burst corresponds to. A reserved pin of the memory system (e.g., a "do not use" pin (DNU pin)) may be coupled to the burst indicator generator. The burst indicator generator may be fed the output of the command decoder and the output of the timing generator (e.g., timing generator 109 and command decoder 125 of FIG. 1 as described below). The output may be command signals (e.g., signals corresponding to a read burst and/or a write burst or another command) of a command burst waveform. The burst indicator generator may generate a burst indicator waveform. The burst indicator waveform may change logical state in response to a first edge of the command burst waveform and may change logical state again in response to a final edge of the command burst waveform. The burst indicator generator may output the burst indicator waveform to the DNU pin. Thus, the burst indicator waveform may transmit via the DNU pin, such as to the oscilloscope. As is further described below, the burst indicator generator may be turned on using a variety of different methods. In one example, the burst indicator generator may couple to a second DNU pin that is coupled to a logical high voltage level to cause the burst indicator generator to function. In another example, the DNU pin may be directly pulled up to the logical high voltage level to cause the burst indicator generator to function. In a third example, the burst indicator function may be activated via register control, and thus the burst indicator generator may generate the burst indicator waveform in response to data written to a mode register. The mode register may be a normal mode register or a dedicated test mode register, as described below.

By using the burst indicator generator systems and methods, data-related command bursts, like read bursts and write bursts, from a variety of memory devices and resulting DQ signals may be tested with reduced amounts of or no interference from a number of ranks or data outliers. Thus, the burst indicator generator systems and methods may result in greater reliability and improved performance from being able to more readily diagnose and/or validate system timing errors. Furthermore, since the burst indicator generator systems and methods use one or two DNU pins, these solutions may comply with some industry specifications, like JEDEC specifications.

FIG. 1 is a schematic block diagram of a semiconductor memory device 100, in accordance with an embodiment of the present disclosure. For example, the semiconductor memory device 100 may include a chip 135 and a ZQ resistor (RZQ) 155. The chip 135 may include a clock input circuit 105, an internal clock generator 107, a timing generator 109, an address command input circuit 115, an address decoder 120, a command decoder 125, a plurality of row decoders 130, a memory cell array 145 including sense amplifiers 150 and transfer gates 195, a plurality of column decoders 140, a plurality of read/write amplifiers 165, an input/output (IO) circuit 170, a ZQ calibration circuit 175, and a voltage generator 177. The semiconductor memory device 100 may include a plurality of external terminals including address and command terminals coupled to command/address (C/A) bus 110, clock terminals CK and/CK, data terminals DQ, DQS, and DM, power supply terminals VDD (e.g., VCC), VSS, VDDQ, and VSSQ, and a calibration terminal ZQ. The chip 135 may be mounted on a substrate, for example, a memory module substrate, a mother board, or the like.

The memory cell array 145 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL for each bank is performed by a corresponding row decoder 130 and the selection of the bit line BL is performed by a corresponding column decoder 140. The plurality of sense amplifiers 150 are located for their corresponding bit lines BL and coupled to at least one respective local IO line further coupled to a respective one of at least two main IO line pairs, via transfer gates (TG) 195, which may function as switches.

The address command input circuit 115 may receive an address signal and a bank address signal from outside of the semiconductor memory device 100 at the command/address terminals via the C/A bus 110 and transmit the address signal and the bank address signal to the address decoder 120. The address decoder 120 may decode the address signal received from the address command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address command input circuit 115 may receive a command signal from outside of the semiconductor memory device 100, such as, for example, a memory controller at the command/address terminals via the C/A bus 110 and provide the command signal to the command decoder 125. The command decoder 125 may decode the command signal and provide or generate various internal command signals. For example, the internal command signals may include a row command signal to select a word line, a column command signal, such as a read command or a write command, to select a bit line, and a ZQ calibration command that may activate the ZQ calibration circuit 175.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside of the semiconductor memory device 100 via the data terminals DQ, DQS and DM together with a data strobe signal at DQS and a data mask signal at DM. Similarly, when the write command is issued and a row address and a column address are timely supplied with the write command, and then the IO circuit 170 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

Returning to the explanation of the external terminals included in the semiconductor memory device 100, the clock terminals CK and/CK may receive an external clock signal and a complementary external clock signal, respectively. The external clock signals (including the complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address command input circuit 115. Although not limited thereto, a delay locked loop (DLL) circuit may be used as the internal clock generator 107. The internal clock generator 107 may provide the phase controlled internal clock signal LCLK to the IO circuit 170 and a timing generator 109. The IO circuit 170 may use the phase controller internal clock signal LCLK as a timing signal for determining an output timing of read data. The timing generator 109 may receive the internal clock signal ICLK and generate various internal clock signals.

The power supply terminals may receive power supply voltages VDD and VSS. These power supply voltages VDD and VSS may be supplied to a voltage generator circuit 177. The voltage generator circuit 177 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The power supply terminals may also receive power supply voltages VDDQ and VSSQ. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170 and the ZQ calibration circuit 175.

Figure 2:
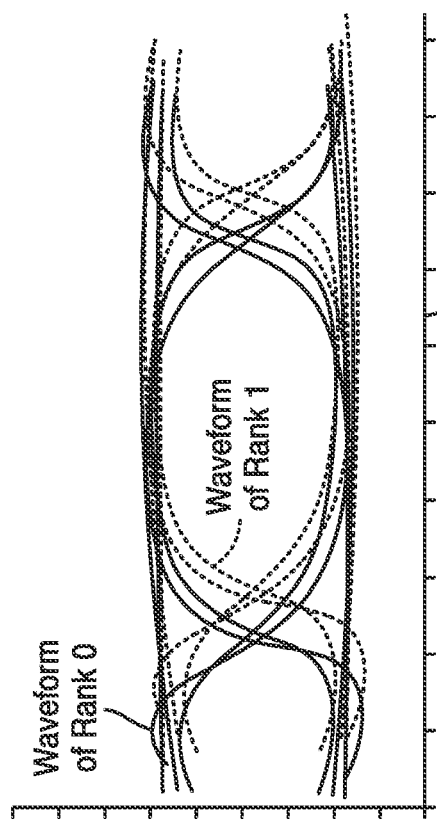
FIG. 2 is a block diagram of a system that may include the semiconductor memory device of FIG. 1, in accordance with an embodiment of the present disclosure.
Figure 2:
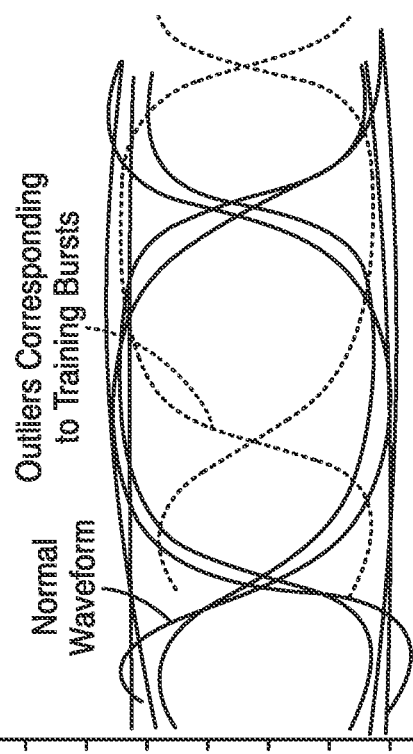
Figure 2:
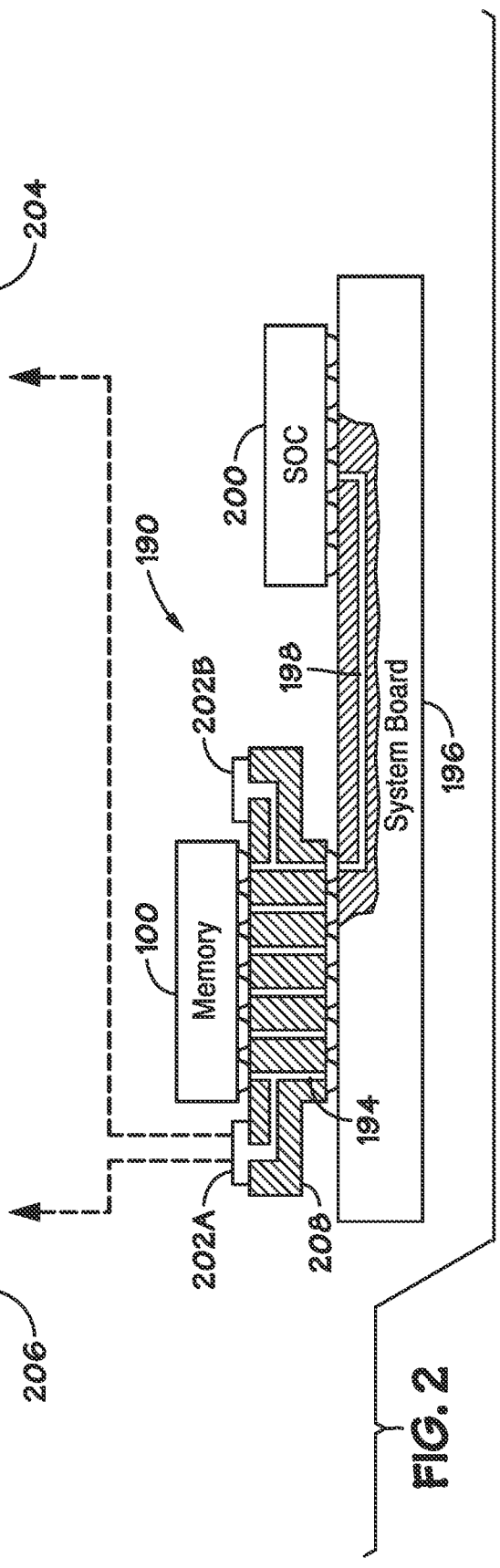

Keeping the foregoing in mind, FIG. 2 is a block diagram of a system 192 that includes the semiconductor memory device 100. The semiconductor memory device 100 may be disposed on an interposer 208. The interposer 208 may include vias 194 that couple to both the semiconductor memory device 100 and conductive pathways (e.g., bus) inlaid or on a system board 196. For example, a conductive pathway 198 may be inlaid (e.g., embedded) into the system board 196. A system-on-a-chip (SOC) 200 may be coupled to the semiconductor memory device 100 via the conductive pathway 198.

Test pads 202 (test pad 202A, test pad 202B) may be disposed on the interposer 208 and adjacent to edges of the semiconductor memory device 100. The test pads 202 may each be conductive pads, conductive pins, or another suitable conductive metal surface from which a probe can measure outputs respectively driven to the test pads. For example, an oscilloscope probe may be coupled to one or more of the test pads 202 to measure a waveform via one or more of the test pads 202. As described above, sometimes signals measured via the test pads 202 are inaccurate, such as when an eye diagram is distorted with multiple rank waveforms (e.g., case 1 diagram 204) and/or when data outliers interfere with the eye diagram (e.g., case 2 diagram 206). To remedy this, a burst indicator generator may be included in the semiconductor memory device 100 to help with isolating the target waveform from interfering signals.

Figure 3:
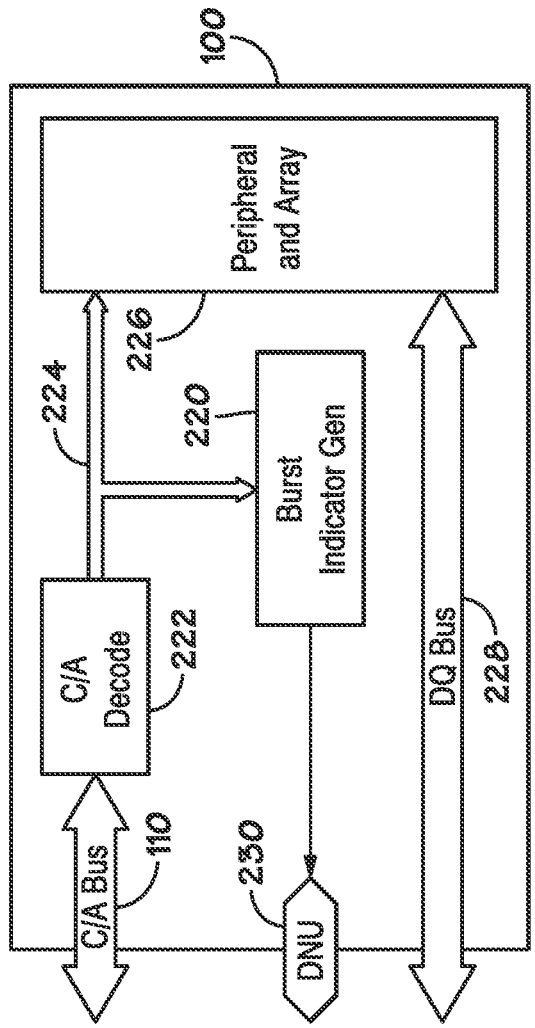
FIG. 3 is a block diagram of a portion of the semiconductor memory device of FIG. 1 that includes a burst indicator generator, in accordance with an embodiment of the disclosure.

FIG. 3 is a block diagram of the semiconductor memory device 100 that includes a burst indicator generator 220. A command/address decoder (C/A decoder) 222 may include the address command input circuit 115, the address decoder 120, and the command decoder 125 of FIG. 1, and any additional circuitry to generate command bursts based on signals received via the C/A bus 110. The C/A bus 110 may transmit a command signal and address signal to the C/A decoder 222. The C/A decoder 222 may generate command/address waveforms. The command/address waveforms may be transmitted via bus 224 to peripheral and array circuitry 226 and to the burst indicator generator 220. The peripheral and array circuitry 226 may be communicatively coupled to the C/A decoder 222 and the burst indicator generator 220 through a same bus, bus 224. The peripheral and array circuitry 226 may use the command/address waveforms to read, write, or otherwise access data from the memory cell array 145, and thus may include the row decoders 130. Data read from the memory cell array 145 may be output via a DQ bus 228, which may transmit the read data to the IO circuit 170 of FIG. 1 and/or to other portions of the semiconductor memory device 100.

The burst indicator generator 220 may generate a burst indicator waveform and may transmit the burst indicator waveform via a "do not use" reserved pin 230 (DNU pin 230) based on one or more received command/address waveforms. The burst indicator waveform may be a 1 bit-wide indicator that an oscilloscope may be set to as a trigger or filter condition for the interested burst type. The output burst indicator waveform may be used to denote what command the DQ bus data burst corresponds to. The burst indicator waveform may be synced to a DQ bus 228 clock domain, which may align with a data clock (DQS) signal. An example of the burst indicator waveform is shown in FIG. 4.

Figure 4:
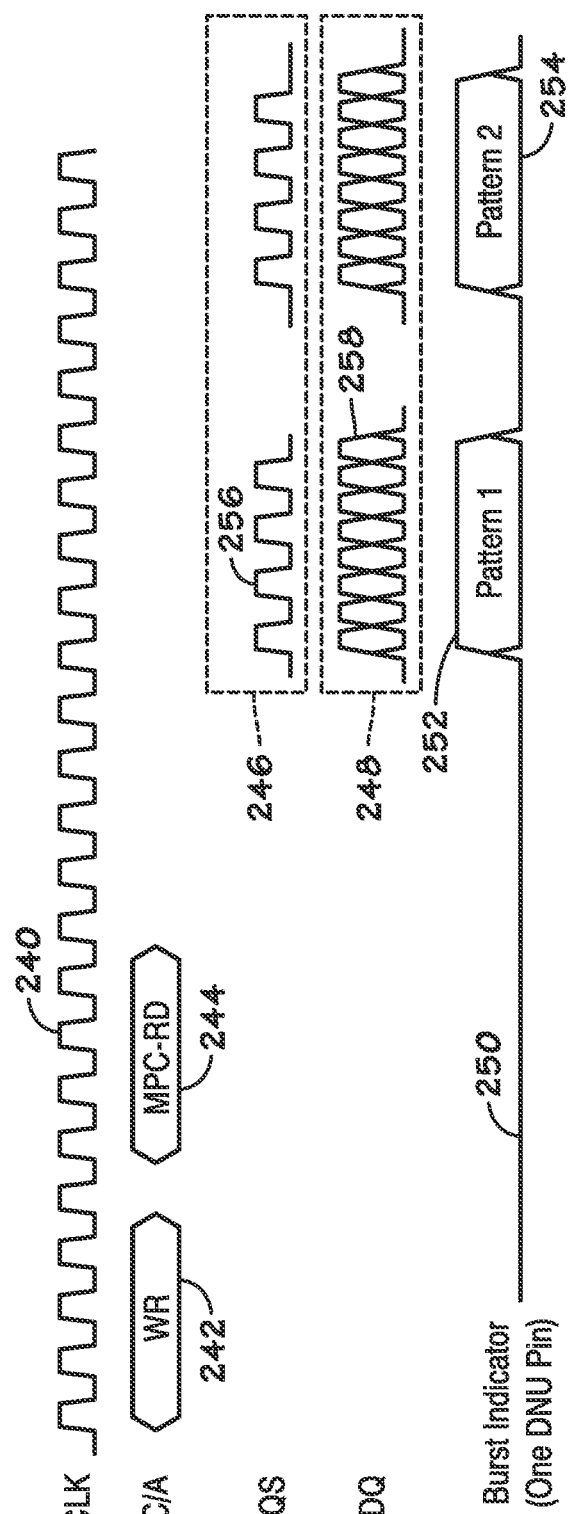
FIG. 4 is a timing diagram of various data and clocking signals of the semiconductor memory device of FIG. 1 that includes a burst indicator waveform having a first burst and a second burst generated by the burst indicator generator of FIG. 3, in accordance with an embodiment of the present disclosure.

FIG. 4 is a timing diagram of various data and clocking signals of the semiconductor memory device 100. The data and clocking signals include, for example, a system clock 240, a first command burst 242, a second command burst 244, data (DQ) bursts 248 (DQ bursts), data clock (DQS) bursts 246, and a burst indicator waveform 250. It should be understood that this is one example of how the burst indicator generator 220 and burst indicator waveform 250 may be implemented and that other implementations that afford similar signal sensing with reduced noise benefits may be employed.

The system clock 240 may be a global clock signal used by components of the semiconductor memory device 100 and/or external to the semiconductor memory device 100 (such as electronic system that communicates and/or includes with the semiconductor memory device 100 to read or write data). The first command burst 242 and the second command burst 244 may be command bursts generated based on signals from the C/A bus 110. The DQ bursts 248 may indicate data read from the semiconductor memory device 100 or data to be written to the semiconductor memory device 100. The DQS bursts 246 may be clocking signals generated based on the timing of the DQ bursts 248 to enable components of the semiconductor memory device 100 to transmit and/or process the DQ bursts 248.

Referring briefly to both FIG. 3 and FIG. 4, the burst indicator waveform 250 is an example signal generated by the burst indicator generator 220, such as in response to the data-related command being received at C/A decoder 222 and/or in response to DQ bursts 248 transmitted via the DQ bus 228. The different bursts of the burst indicator waveform 250 (e.g., first burst 252, second burst 254) respectively correspond to command bursts received (e.g., first command burst 242, second command burst 244) that result in one or more DQ bursts 248 being transmitted on the DQ bus 228. For example, the first burst 252 of the burst indicator waveform 250 corresponds to DQ burst 258 handled in response to the first command burst 242 using DQS signal 256. An oscilloscope may be set to trigger the pattern of the second burst 254 corresponding to the training command, for example, training command MPC-RD (e.g., MPC-RD FIFO), or, in some cases, to trigger the pattern of the first burst 252 corresponding to a read command for selective DQ signal filtering. Although referred to herein as special commands MPC-RD or MPC-WR, it should be understood that these are examples of naming conventions and any suitable name could be used for a training command, such as a name selected based on a controlling standards or specifications. For example, a Low-Power Double Data Rate (LPDDR4) JEDEC specification uses the term "MPC-RD FIFO" as a read training command and uses the term "MPC-WR FIFO" as a write training command.

To generate the burst indicator waveform 250, a data-related command is received via the C/A bus 110. Data-related commands include commands like a read command (READ), a write command (WR), a masked write command (MASKED WR), a masked read command (MASKED RD), a multi-purpose command (MPC), a mode register read command (MRR), or the like. Some devices may use a MPC first-in/first out device (FIFO) command, such as a MPC read command (MPC-RD FIFO) and/or a MPC write command (MPC-WR FIFO), in which data is either read or written to a FIFO within the semiconductor memory device 100 as opposed to being read from a capacitor-based array (e.g., memory cell array 145) and transmitted via the DQ bus 228.

When one of the data-related commands being received at the C/A decoder 222, after a latency duration (e.g., CL, CWL), a corresponding data burst is transmitted on the DQ bus 228. The semiconductor memory device 100 via the burst indicator generator 220 may identify (e.g., decode) each data-related command received via the C/A bus 110 and infer the timing window in which the corresponding subset of the DQ bursts 248 are transmitted on the DQ bus 228. The ability to infer the timing window may be based at least in part on how the DQ bursts 248 may be sent via the DQ bus 228 in response to a data-related command a specific amount of time after the data-related command is received by the C/A decoder 222 via the C/A bus 110. Based on the latency duration and/or a time of receipt of the data-related command at the C/A decoder 222, the burst indicator generator 220 may identify the command type and output a corresponding code via the DNU pin 230 as the burst indicator waveform 250.

The burst indicator generator 220 may generate the code by outputting the burst indicator waveform 250 at constant voltage levels, by outputting encoded voltage levels indicating the code, or the like. The code may be a constant "1" or "0" (e.g., logical high signal or logical low signal), a predefined code output based on the type of command indicated via the command and address signals, or a field-programmable code (e.g., configurable), or the like. The burst indicator generator 220 may generate the code indicated by the burst indicator waveform 250 based on timing of DQ bursts 248 on the DQ bus 228. Since both the constant logical high data signal and the encoded burst indicator waveform 250 may have a timing matching or substantially similar to the timing of the respective DQ burst, an oscilloscope trigger or filter operation may be set up to sample the timing of the constant logical high data signal or the encoded burst indicator waveform 250, which may enable validation operations of system timing when before no such validation was able to be performed in cases where rank signals were mixed and/or where data outliers were present. Furthermore, there may be added benefit from the burst indicator generator 220 encoding the burst indicator waveform 250 as opposed to using constant values, such as if the memory controller, the host device (e.g., system that includes or communicates with the semiconductor memory device 100), or the like, would like to track which DQ bursts 248 corresponds to which commands transmitted via C/A bus 110. FIGS. 5-9 describe these examples further.

Figure 5:
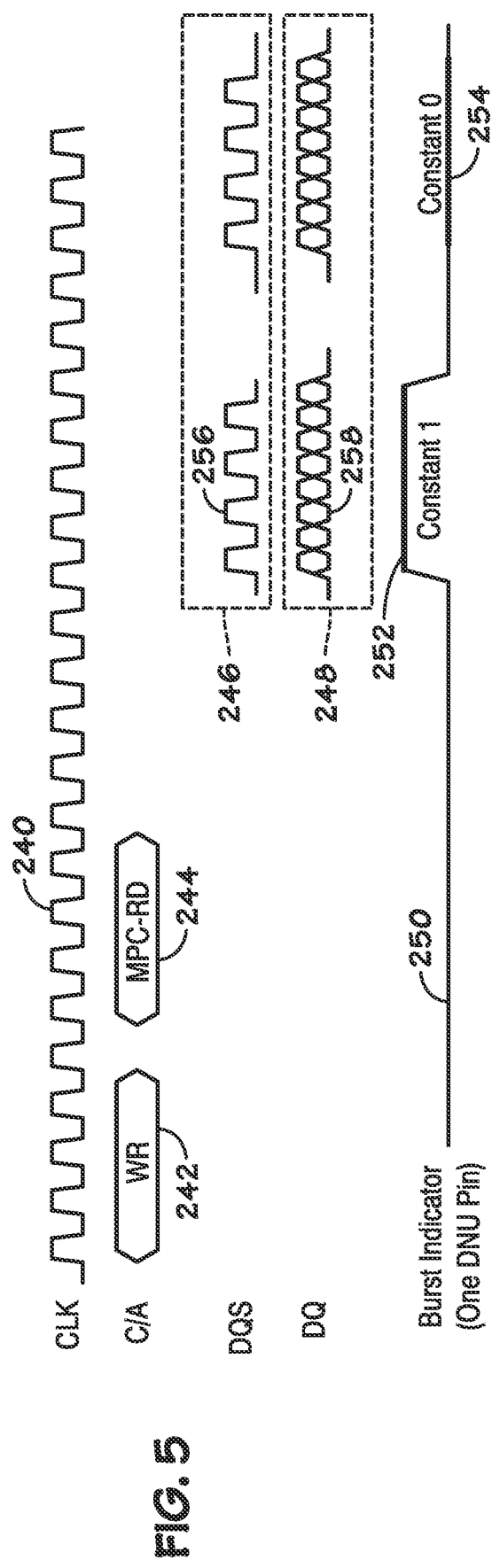
FIG. 5 is a timing diagram of the various data and clocking signals of the semiconductor memory device of FIG. 1 that includes the burst indicator waveform of FIG. 4 as having a first constant burst as the first burst and a second constant burst as the second burst, in accordance with an embodiment of the present disclosure.

FIG. 5 is a timing diagram of the various data and clocking signals of the semiconductor memory device 100 that includes the burst indicator waveform 250 as having a first constant burst as the first burst 252 and a second constant burst as the second burst 254. Similar to FIG. 4, the data and clocking signals include the system clock 240, the first command burst 242, the second command burst 244, data (DQ) bursts 248, data clock (DQS) bursts 246, and the burst indicator waveform 250.

The first burst 252, when a first constant burst, may have an opposite logical value from the second burst 254, when a second constant burst. Indeed, the first constant burst has a constant logic high value (e.g., "1," logical high voltage value) and the second constant burst has a constant logic low value the (e.g., "0," logical low voltage value). It is noted that any number of first constant bursts and second constant bursts may be generated sequentially based on which commands are transmitted via the C/A bus 110.

Referring briefly to both FIG. 3 and FIG. 5, the burst indicator generator 220 may toggle the burst indicator waveform 250 respectively for one or more (e.g., each) of the various DQ bursts 248. The burst indicator generator 220 may toggle the value of the burst indicator waveform 250 to become a logical high level (e.g., "1," equal to a suitable voltage value to be processed as a "1" or logical high data value) in response to detecting a first rising edge of a DQ burst of the DQ bursts 248, such as DQ burst 258. However, in response to a last rising edge of the DQ burst of the DQ bursts 248 (e.g., DQ burst 258) subsequent to the first rising edge of the DQ burst 258, the burst indicator generator 220 may toggle the value of the burst indicator waveform 250 to become a logical low level (e.g., "0," equal to a suitable voltage value to be processed as a "0" or as a logical low data value).

This example of the burst indicator generator 220 generating the code by outputting constant voltage levels as the burst indicator waveform 250 may be limited to two valid values for the burst indicator waveform 250. That is, the constant voltage levels may correspond to a logical low voltage level and/or a logical high voltage level, where the specific voltages may correspond to system reference voltage levels, semiconductor memory device 100 specific voltage levels, or the like. The different constant voltage levels may be used to indicate the different commands received at C/A decoder 222, for example a constant "0" output may denote a burst used for training or memory timing validation operations (e.g., MPC-RD FIFO, MPC-WR FIFO) but a constant "1" output may denote a burst used for normal data access operations (e.g., WRITE, MASKED WRITE, READ, MRR).

Some devices, however, may operationally benefit from encoding the burst indicator waveform 250 to indicate both a type of data-related command and a timing of the data-related command. One or more bits may be represented by changing voltage levels of the burst indicator waveform 250.

Figure 6:
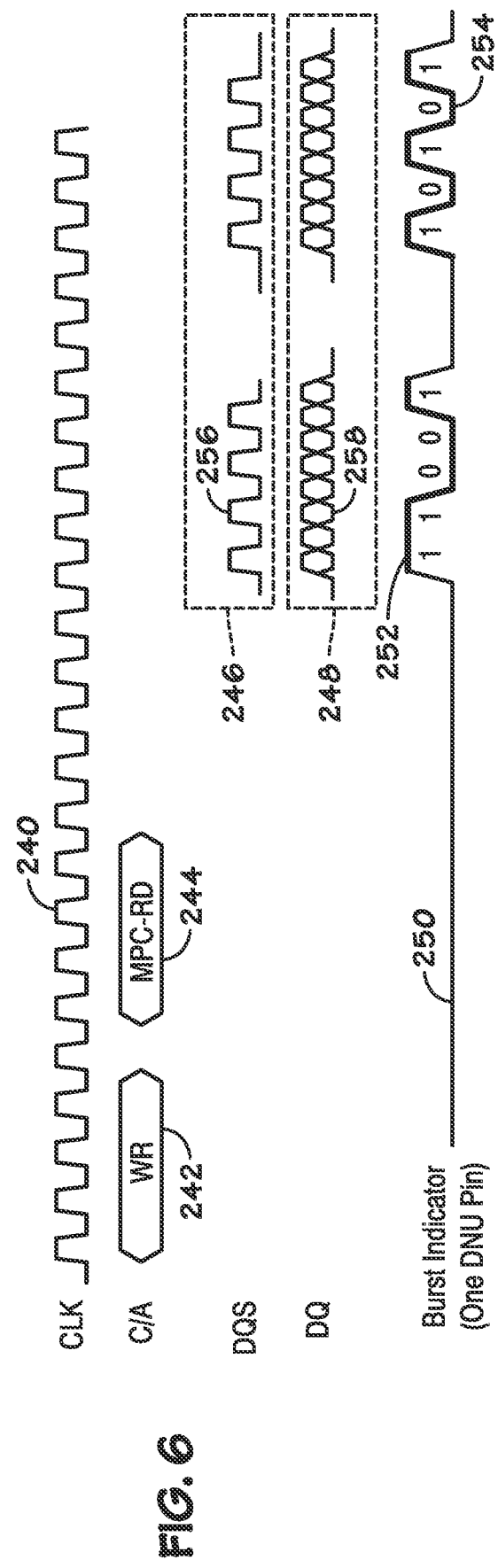
FIG. 6 is a timing diagram of the various data and clocking signals of the semiconductor memory device of FIG. 1 that includes the burst indicator waveform of FIG. 4 as having a first encoded burst as the first burst and a second encoded burst as the second burst, in accordance with an embodiment of the present disclosure.

To elaborate, FIG. 6 is a timing diagram of the various data and clocking signals of the semiconductor memory device 100 that includes the burst indicator waveform 250 as having a first encoded burst as the first burst 252 and a second encoded burst as the second burst 254. Similar to FIGS. 4 and 5, the data and clocking signals include the system clock 240, the first command burst 242, the second command burst 244, data (DQ) bursts 248, data clock (DQS) bursts 246, and the burst indicator waveform 250. Indeed, although the two constant voltage levels used may match those voltage levels of the constant bursts of FIG. 5, one or more voltage level changes representing logical bit encoding may be used within a same timing period of the corresponding DQ bursts 248. The timing period of the encoded burst of the burst indicator waveform 250 may also differ from the timing period of the corresponding DQ burst (e.g., first burst 252 may have a duration lesser than or greater than the DQ burst 258 duration). Furthermore, although described as a waveform or signal, the burst indicator waveform 250 may be considered an indicator transmitted via the DNU pin 230 as opposed to a contiguous waveform transmitted via the DNU pin 230.

The first burst 252, when a first encoded burst, may include a combination of two or more logical values that may be the same or different from the second burst 254, when a second encoded burst. Indeed, the first encoded burst has various logic high values (e.g., "1") and logic low values (e.g., "0") forming a sequence of "11001." However, the second encoded burst has various logic high values (e.g., "1") and logic low values (e.g., "0") forming a sequence of "10101." It is noted that any number of first encoded bursts and second encoded bursts may be generated sequentially based on which commands are transmitted via the C/A bus 110.

When the burst indicator generator 220 encodes the bursts (e.g., first burst 252, second burst 254, other additional bursts not illustrated) of the burst indicator waveform 250, a number of encoding sequences that the burst indicator generator 220 selects between to encode the burst may match a number of possible data-related commands able to be transmitted via the C/A bus 110 that result in DQ bursts 248 transmitting via the DQ bus 228 (e.g., example of Table 1). However, some methods of encoding may group together types of data-related commands and distinguish between read and write commands and training and normal commands (e.g., example of Table 2). Furthermore, in some cases, the code length of the sequence encoded into the burst indicator waveform 250 may have a length unequal to a length of the DQ burst (e.g., DQ burst 258)

Indeed, encoded bursts generated may follow a relationship illustrated in Table 1. The burst indicator generator 220 may encode a portion of the burst indicator waveform 250 based on a stored relationship (e.g., Table 1) in a local memory that associates various binary sequences to be encoded on the burst indicator waveform 250 and the data-related command bursts received via the C/A bus 110 (e.g., first command burst 242, second command burst 244).

TABLE 1

| Burst Type | Indicator Code |
| --- | --- |
| RD | 10001 |
| MRR | 10011 |
| MPC-RD FIFO | 10101 |
| WR | 11001 |
| Masked WR | 11011 |
| MPC-WR FIFO | 11101 |

Another example for encoding may be illustrated in Table 2. In this second example of encoding different bit positions of the resulting encoded code of the burst indicator waveform 250 may correspond to different indications.

TABLE 2

| | Indicator Code | | | |
| --- | --- | --- | --- | --- |
| Burst Type Bit position | $1^{st}$ = Preamble | $2^{nd}$ = "1" Write, "0" Read | $3^{rd}$ = "1" normal command, "0" training command | $4^{th}$ = Post amble |
| RD, MRR | 1 | 0 | 1 | 1 |
| MPC-RD FIFO | 1 | 0 | 0 | 1 |
| WR, Masked WR | 1 | 1 | 1 | 1 |
| MPC-WR FIFO | 1 | 1 | 0 | 1 |

As shown in Table 2, a first, most significant bit may correspond to a preamble indication, a second bit may correspond to a read or write indication, a third bit may correspond to a normal operation or a training operation indication, and a fourth bit may correspond to a post amble. The preamble (e.g., $1^{st}$ bit) and post amble (e.g., $4^{th}$ bit) may be a same "1" bit or a same "0" bit, or a same sequence of bits. For example, a read command and a MRR command transmitted, respectively, via the C/A bus 110 may similarly correspond to a code of "1011" in the burst indicator waveform 250. A MPC-RD FIFO command may correspond to a code of "1001" in the burst indicator waveform 250. A WR command and a MASKED WR command may similarly correspond to a code of "1111" in the burst indicator waveform 250. A MPC-WR FIFO command may correspond to a code of "1001" in the burst indicator waveform 250.

Figure 7:
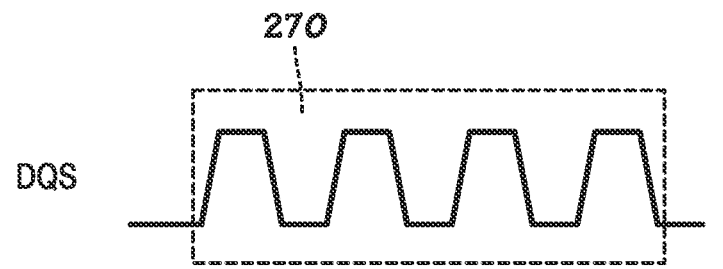
FIG. 7 is a plot of a sample DQS burst and a sample burst indicator, in accordance with an embodiment of the present disclosure.
Figure 7:
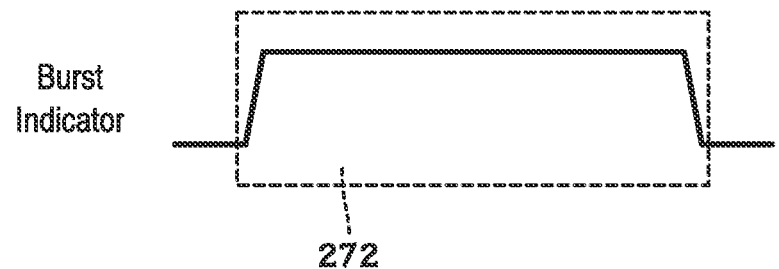

Based on the constant value or the encoded code of the burst indicator waveform 250, a processing system, such as a processing system of an oscilloscope, analyzing the output burst indicator waveform 250 and the output DQ bursts 248 may selectively filter out the DQ bursts 248 corresponding to the "training" command indicator. To elaborate, FIG. 7 is a plot of a sample DQS burst 270 (e.g., a portion of the DQS bursts 246) and a sample burst indicator 272. The DQS bursts 246 output in accordance with DQ bursts 248 from the DQ bus 228 and may be used to sample the DQ bursts 248 from the DQ bus 228. In this example, the sample burst indicator 272 indicates a normal command when having a logical high voltage level (e.g., "1"). This may enable filtering out a constant "1" for the burst indicator waveform 250 which may improve an accuracy of filtering operations and make signals resulting from the filtering less noisy. The processing system may detect whether the sample burst indicator 272 indicates a normal command or a training command. When the sample burst indicator 272 indicates a normal command, the processing system may sample the data from the DQ bursts 248 output via the DQ bus 228. Some measurement methods, such as those that use an oscilloscope, may use both the sample burst indicator 272 and the DQS burst 270 when filtering the data of the DQ bursts 248 output. Sampling and validation systems and methods based on the burst indicator waveform 250 may technically benefit from reduced amount of processing resources being used to determine which of the DQ bus 228 output signals to sample for validation, which may further reduce power consumption or enable more efficient allocation of computing resources.

Keeping the foregoing in mind, FIGS. 8-11 describes several proposed systems to enable selective activation of the burst indicator generator 220. By selectively turning on and off the burst indicator generator 220, power may be further conserved by enabling selective generation of the burst indicator waveform 250.

Figure 8:
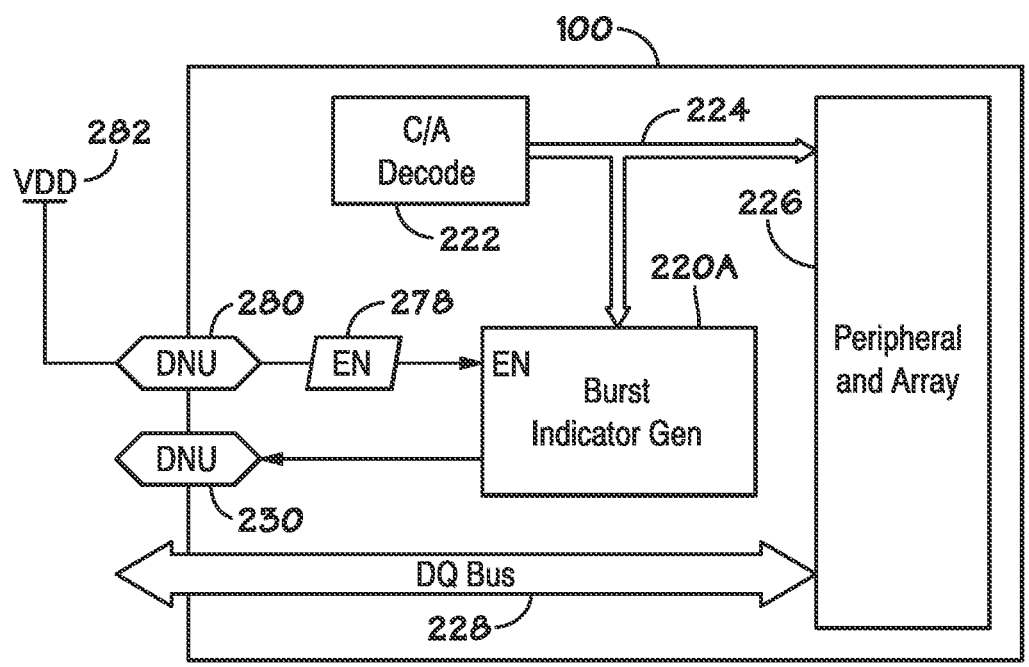
FIG. 8 is block diagram of the semiconductor memory device of FIG. 1 that includes an enable input to a first example burst indicator generator, in accordance with an embodiment of the present disclosure.

For example, FIG. 8 is block diagram of the semiconductor memory device 100 that includes an enable input to the burst indicator generator 220. The burst indicator generator 220 may generate the burst indicator waveform 250 when a second DNU pin 280 is coupled to a voltage source 282, such as a positive voltage source for the system (VDD), which may generate an enable signal 278. A weak pull-down resistor (not illustrated) may pull an enable pin (EN) to ground so that the burst indicator generator 220 is disabled by default. The pull-down resistor may provide immunity of noise when the DNU pin 280 is not externally tied to the voltage source 282 (VDD). During validation tasks, users could manually connect DNU pin 280 to the voltage source 282 (VDD) through a wire that may be considered a strong pull up (e.g., negligible resistance value) to enable the burst indicator generator 220. The second DNU pin 280 may be switched to couple to the voltage source 282 by a switch between the voltage source 282 and the DNU pin 280 and/or a switch between the DNU pin 280 and the burst indicator generator 220.

Figure 9A:
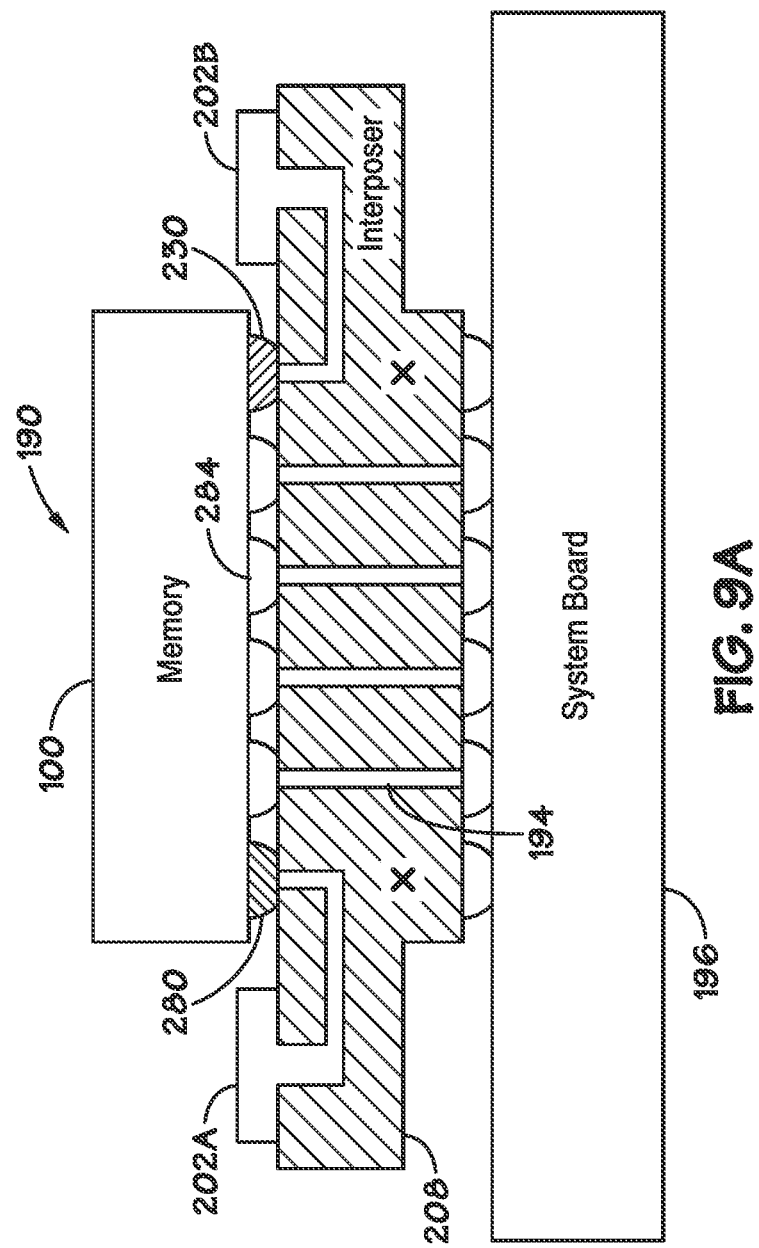
FIG. 9A is a block diagram of the system of FIG. 2 that includes the semiconductor memory device of FIG. 1 disposed on the interposer of FIG. 2, in accordance with an embodiment of the present disclosure.

To further elaborate on the example of FIG. 8, FIG. 9A is a block diagram of the system 190 that may include the semiconductor memory device 100 disposed on the interposer 208 and FIG. 9B is a block diagram of a top view of the system 190 with example couplings associated with conductive package balls 284. The semiconductor memory device 100 may include the DNU pin 280 and the DNU pin 230 of FIG. 8. Although similar to the example of FIG. 2, in FIG. 9A an additional probing pad may be added for the DNU pin 280.

In FIG. 2, FIG. 9A, and FIG. 9B, the package balls 284 (excluding the DNU pin 230 and the DNU pin 280) of the semiconductor memory device 100 may connect to the system board 196 and/or the SOC 200 through vias 194 embedded in an interposer 208. For certain package balls 284 (e.g., pins) of the semiconductor memory device 100, additional branch vias (within the interposer 208) may connect to the pads 202 (refer to FIG. 2), so that waveforms sent via those package balls 284 may be measured. This yields several options where a given package ball 284 may be coupled to one of the test pads 202 (e.g., diagram 285, when waveforms transmitted through the via may be measured), the system board 196 (e.g., diagram 286, when waveforms transmitted through the via may not be measured), or both (e.g., diagram 287, when waveforms transmitted through the via may be measured). The example of FIG. 8 may have the DNU pin 280 and the DNU pin 230 respectively coupled to test pads 202 through blind vias or vias unconnected to the system board 196 (e.g., example via 194A). Since the DNU pin 280 and the DNU pin 230 are used for validation, communicative couplings may not be made to the SOC 200. Here, the "X" graphically represents how the DNU pins 280, 230 are not connected to the system board 196 or SOC 200. The blind vias may have the added benefit of being more resilient to tampering by users and/or communicating systems, making it more complex to detect or change, and/or increasing a likelihood of the validations being performed without interruption, thereby improving device operation by enabling testing and adjustment to system timing.

Figures 10A, 10B:
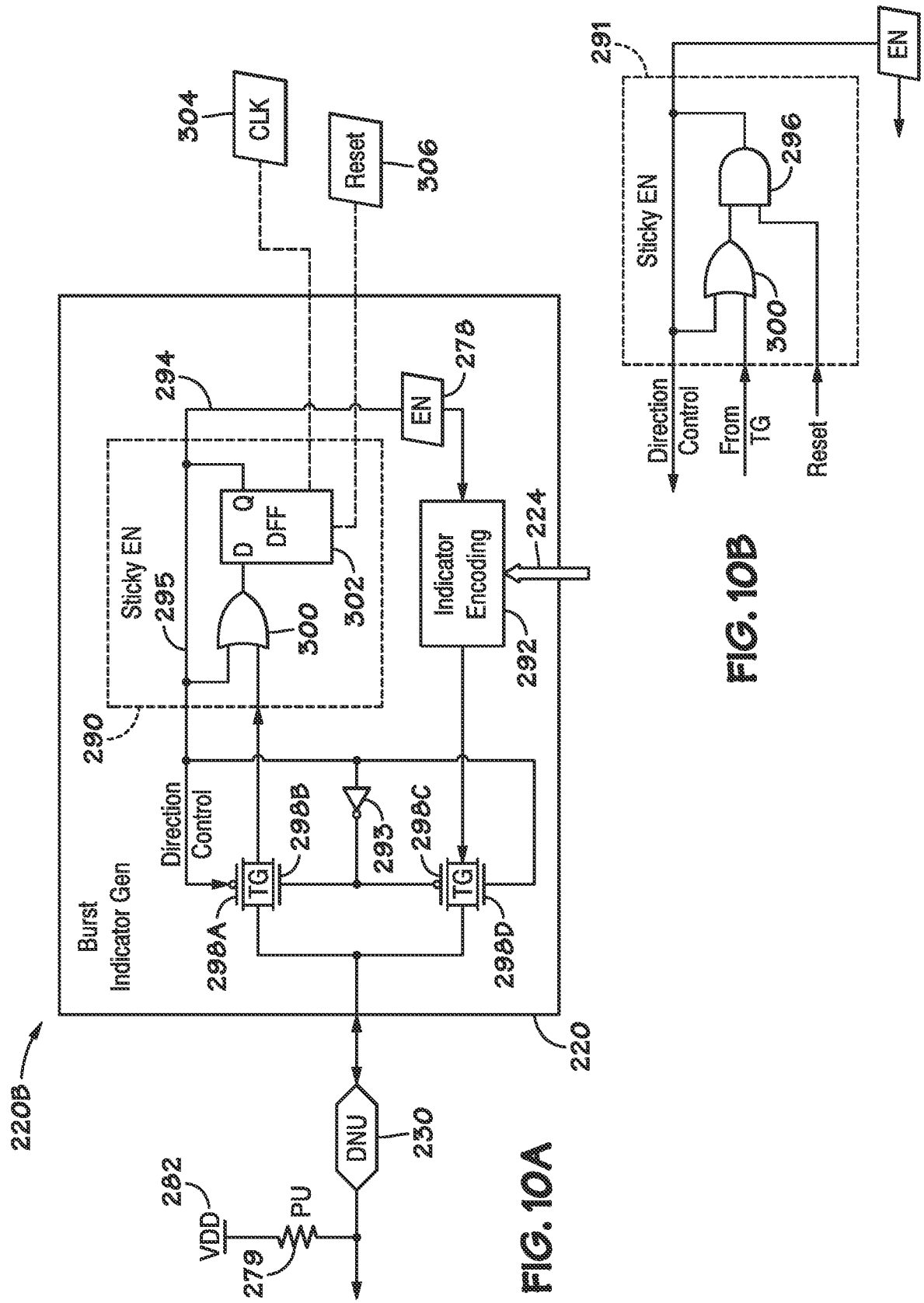
FIG. 10A is a block diagram of a second example burst indicator generator that responds to an enable signal delivered via a single DNU pin, in accordance with an embodiment of the present disclosure.
FIG. 10B is a block diagram of alternative circuitry of the second example burst indicator generator of FIG. 10A, in accordance with an embodiment of the present disclosure.

Another proposed system to enable selective activation of the burst indicator generator 220 is shown in FIG. 10A and FIG. 10B. FIG. 10A is a block diagram of an example burst indicator generator 220B that responds to an enable signal 278 delivered based on signals from a single DNU pin 230 while coupled to a voltage source 282 and FIG. 10B is a block diagram of an alternative option to be used as a portion of the burst indicator generator 220B, where FIG. 10A and FIG. 10B are discussed together herein. The burst indicator generator 220B may include one DNU pin as opposed to two DNU pins used by the burst indicator generator 220A of FIGS. 8-9.

The burst indicator generator 220B may include sticky enable circuitry 290, indicator encoding circuitry 292, a bus 294, and transistors 298 (transistor 298A, transistor 298B, transistor 298C, transistor 298D). The respective pairs of the transistors 298 and an inverter 293 may form transfer gates (TG). The sticky enable circuitry 290 may include a logic gate, such as an OR gate 300, and a flip-flop, such as a delay (D) flip-flop 302. Some devices may use other logic gates in place of the OR gate 300, like AND gates, not-OR gates, not-AND gates, inverter gates, exclusive-OR gates, or the like, and it should be noted that more than one logic gate may be used in place of the OR gate 300 to perform a similar OR-ing operation (e.g., output a logic high signal in response to at least one input being a logic high signal). For example, diagram 291 of FIG. 10B is an example of alternative sticky enable circuitry 290 based on an OR gate 300 and an AND gate 296, which operates based on the same input from transistors 298 and the reset signal 306 to generate the direction control signal via bus 295 and the enable signal 278 via the bus 294.

The indicator encoding circuitry 292 may be disabled to reduce power consumed by the semiconductor memory device 100 when the indicator encoding circuitry 292 is not used. To enable the indicator encoding circuitry 292, the DNU pin 230 is driven to a logic high, and the internal logic of the burst indicator generator 220B detects the logic high and may fix the direction of the DNU pin 230 to output. The DNU pin 230 may be pulled up to the logic high voltage for a short duration of time sufficient to set the internal logic circuitry of the burst indicator generator 220B (e.g., 1 to 3 clock cycles). The DNU pin 230 may be pulsed to couple to the voltage source 282 and a resulting enable signal 278 delivered to the indicator encoding circuitry 292 may be independent of the input driven via the DNU pin 230, which may enable the voltage source 292 to be decoupled on a state of the sticky enable circuitry 290 is set. In some systems, the DNU pin 230 may couple to the voltage source 282 via a resistor 279, such as a resistor having a relatively large resistance value (e.g., 100 ohms (Ω), 200Ω, 300Ω, and so on based on the application). When enabled, the indicator encoding circuitry 292 may generate the burst indicator waveform 250, such as by encoding the type of command received via bus 224 into the burst indicator waveform 250 or by outputting a constant value. Once the DNU pin 230 is pulled to a logical high voltage level (e.g., coupled to the voltage source 282) externally, such as via a switch (not shown) or through an electrical coupling, the sticky enable circuitry 290 may activate an indictor encoding circuitry 292 via the enable signal 278 on bus 294 and may hold this activated state until a reset event transmits a reset signal 306 to the sticky enable circuitry 290.

In some cases, the reset event may cause a memory controller to transmit the reset signal 306 to the indicator encoding circuitry 292. The "enable" state may be maintained until next reset event or next power cycle, no matter how the DNU pin 230 toggles its signal. The sticky enable circuitry 290 may keep the DNU pin 230 in an always output mode until reset, which may be independent of its input driven by the DNU pin 230. For example, the D flip-flop 302 may latch the output from the OR gate 300 in response to an edge of a clock signal 304. The output from the D flip-flop 302 may enable the indicator encoding circuitry 292 when it is a logical high voltage level (e.g., "1"). To disable the indicator encoding circuitry 292, the value stored in the D flip-flop 302 may be reset to a logical low voltage level (e.g., "0"), such as via a reset signal 306, which transmits to disable the indicator encoding circuitry 292.

When the bus 295 transmits a logical low signal (e.g., "Sticky En"=0), the direction set by the transfer gate (TG) (e.g., transistors 298, inverter 293) is input such that the external DNU is able to change to state of the sticky enable circuitry 290 (e.g., set it). When the bus 295 transmits a logical high signal (e.g., "Sticky En"=1), the direction set by the transfer gate (TG) is output such that the indicator encoding circuitry 292 may drive the burst indicator waveform 250 to the DNU pin 230, while the waveform on the DNU pin 230 is not sent to the sticky enable circuitry 290.

Figure 11:
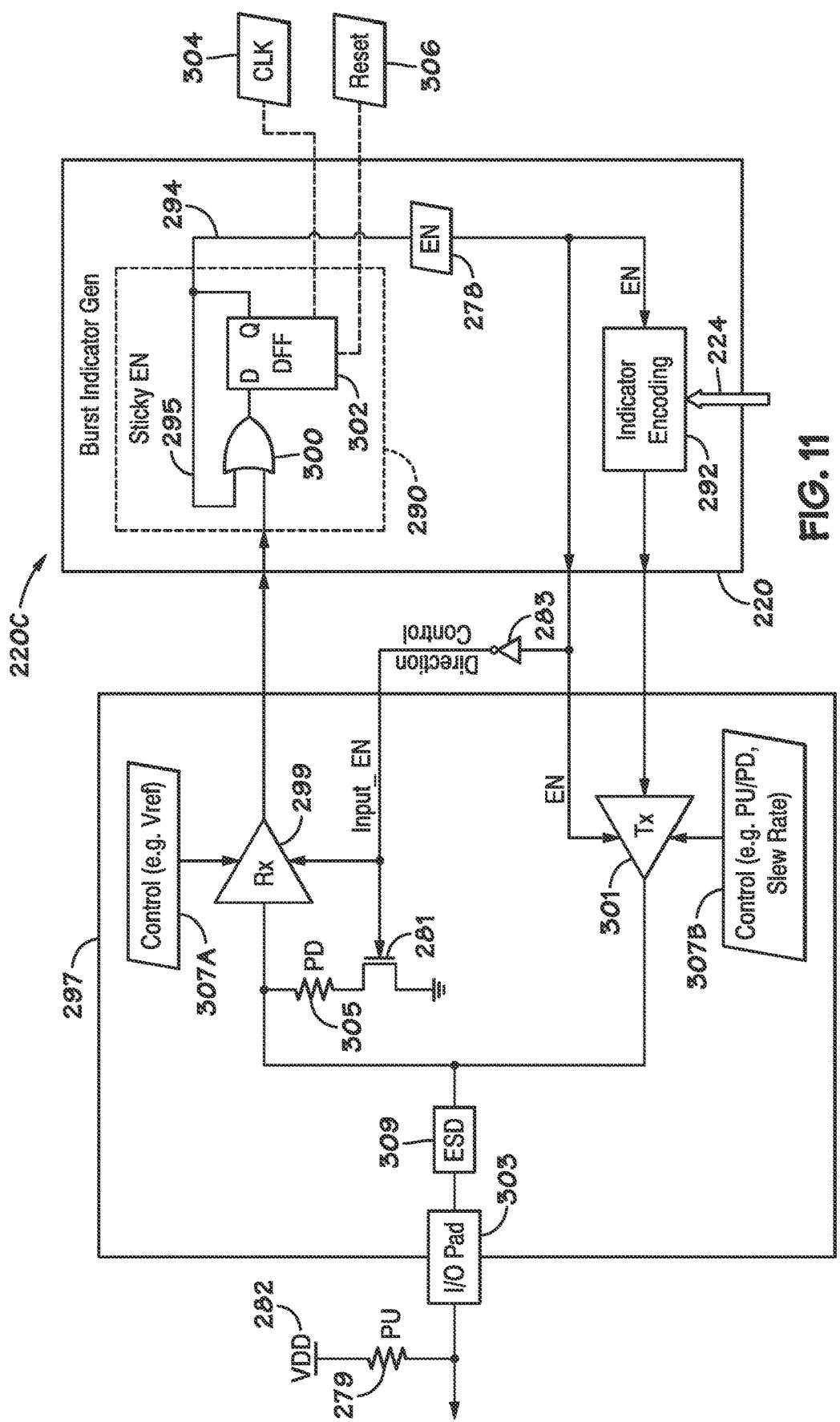
FIG. 11 is a block diagram of a third example burst indicator generator, in accordance with an embodiment of the present disclosure.

It is noted that in some systems, the transistors 298 are replaced with one or more transmitter drivers (TX) and/or one or more receiver drivers (RX) to provide drive strength, such as to adjust a voltage or current delivered as the signal. FIG. 11 is a block diagram of a third example burst indicator generator 220C coupled to a bi-directional IO cell 297, where a voltage pulse may be used to turn on the indicator encoding circuitry 292 via the enable signal 278, similar to the voltage pulse described in FIGS. 10A-10B. The burst indicator generator 220C may couple to a bi-directional IO cell 297. In this example, the direction control circuitry (e.g., transfer gates (TG)) may be implemented using a bi-directional IO cell 297, which may be used as one or more DQ and/or DQS pins in a semiconductor memory device 100 (e.g., IO circuit 170 in FIG. 1). The bi-directional IO cell 297 may include a transistor 281 that operates open or closed in response to a direction control signal from inverter 283. Indeed, when the indicator encoding circuitry 292 is turned on (e.g., EN signal=1), a TX driver 301 may be turned on in response to the EN signal and a RX driver 299 may be turned off in response to an output from an inverter 283 used to invert the EN signal. In this way, the same enable signal 278 sent to the indicator encoding circuitry 292 may be routed through the inverter 283 to the bi-directional IO cell 297 to set a direction of the IO pad 303 as input or output. Although shown as a separate example circuit, it is noted that in some systems, the DNU pin 230 includes some or all of the circuitry shown as the bi-directional IO cell 297 in place of the transistors 298.

TX driver 301 and RX driver 299 may represent analog circuitry that operate as an intermediate device between the external analog waveform and the internal digital logic signal. The RX driver 299 may translate the external analog waveform (applied on an IO pad 303) to an internal logic high or low based on control signals 307A received, such as control signals generated and sent by a memory controller. The control signals may include a reference voltage to control a voltage or current of the signal transmitted to the sticky enable circuitry 290 of the burst indicator generator 220. The TX driver 301 may provide a degree of drive strength based on control signals 307B (e.g., pull-up voltage, pull-down voltage, slew rate to output at), such that the waveform on the IO pad 303 clearly reflects a code sequence (e.g., the code) sent from the indicator encoding circuitry 292. In some cases, electrostatic discharge protection circuitry (ESD) 309 may also be included at the IO pad 303.

The connection to the voltage source 282 may be a static style connection or a dynamic connection. In a static connection, the connection to the voltage source 282 may be constant (or negligibly varying) when the burst indicator waveform 250 is driven out. In this case, the pull up connection (e.g., resistance of resistor 279) may be greater than a resistance of the TX driver 301 but less than an on-die pull down resistor 305 (PD). Indeed, a relatively large resistance may create relatively weak drive strength while a relatively small resistance may create a relatively strong drive strength. In a dynamic connection, the connection between the IO pad 303 and the voltage source 282 continues only a short duration of time to activate the burst indicator generator 220. After that, the connection may be removed so that the burst indicator waveform 250 is not impacted by the pull up connection. The pull-up resistance of the resistor 279 may be stronger than the resistance of the TX driver 301. In some cases, the pull-up resistance of the resistor 279 may be a wire with a resistance of zero. Using a weak resistance resistor for resistor 279 may provide immunity from noise that may occur when the DNU pin 230 is not externally tied to VDD, such that noise on the floating DNU pin 230 may not trigger an inadvertent enable of the burst indicator generator 220. In some cases, the resistor 305 may be implemented in a package level as a pull-down resistor. Furthermore, in some cases, the resistor 305 may not be used if the RX driver 299 is designed to tolerate noise or another mechanism is used to mitigate noise.

Figure 12:
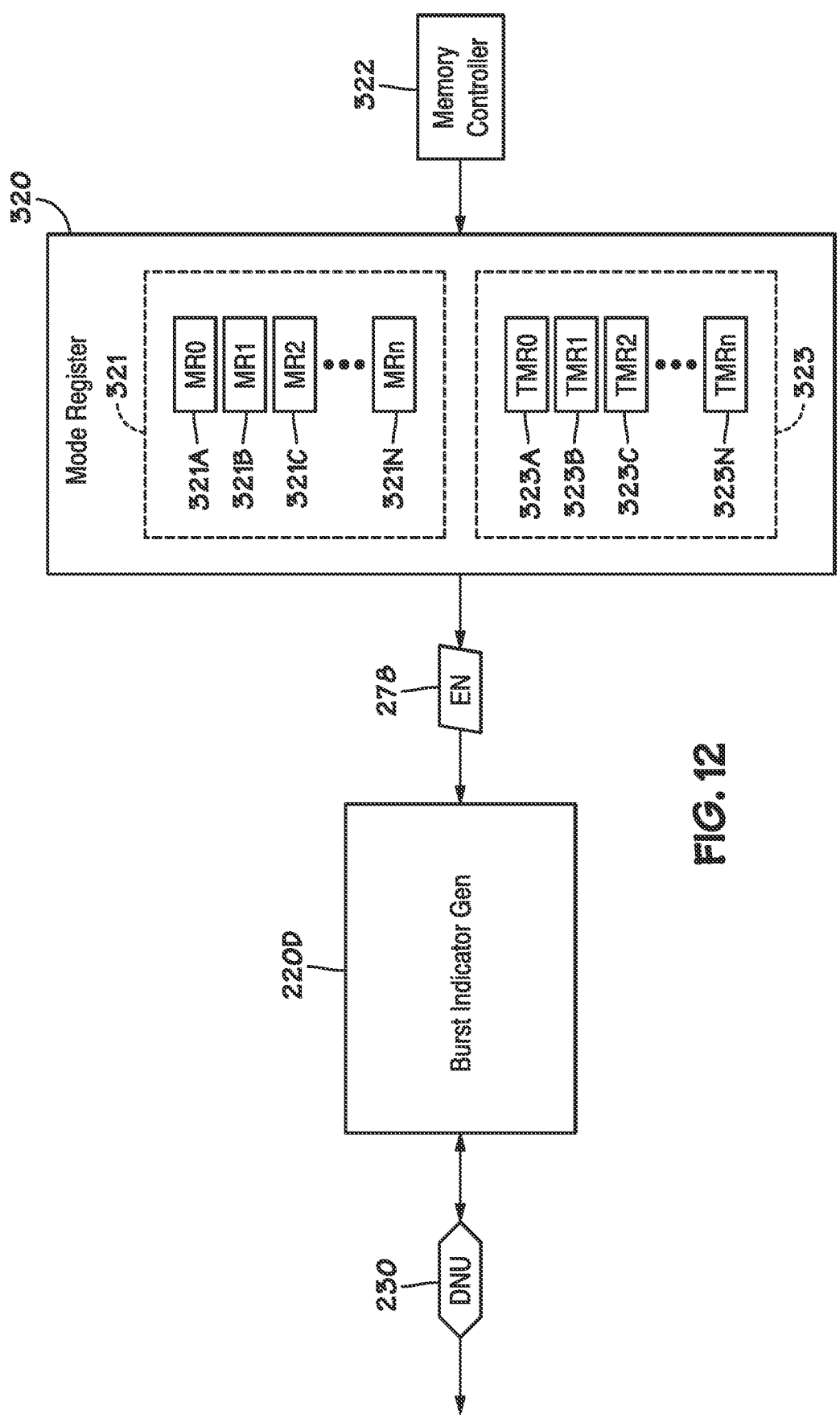
FIG. 12 is a block diagram of a fourth example burst indicator generator, in accordance with an embodiment of the present disclosure.

In yet another example, FIG. 12 is a block diagram of a fourth example burst indicator generator 220D. The burst indicator generator 220D may activate circuitry to generate the burst indicator waveform 250 based on signals from a mode register 320. Indeed, the burst indicator generator 220D may turn on in response to receiving one or more data signals from the mode register 320. The mode register 320 may be a normal mode register 321 or a test mode register 323. A normal mode register 321 may be standardized according to industry specifications, such as the JEDEC specification. The normal mode register 321 may be able to be written to by any user and/or control system. The test mode register 323 may be a hidden register access only by a memory manufacturer. When the burst indicator generator 220D activates based on a test mode register, external users and/or competitor memory vendors may be unable to activate the burst indicator function. The burst indicator generator 220D may activate and generate the burst indicator waveform 250 based on data stored in a mode register 320. Similar methods may be used to directly turn on and off the burst indicator generator 220D (e.g., by directly transmitting an enable signal 278), which may enable use of the burst indicator generator 220D even when the system 192 does not support sending special mode register write sequences used to turn on the burst indicator generator 220D. By using a programmed enable signal 278, either from the mode register 320 or directly from the memory controller 322 (e.g., bypassing a mode register 320), the burst indicator generator 220D may be selectively turned on.

Continuing with the mode register-based example, the mode register 320 may output the data to the burst indicator generator 220D to enable the burst indicator generator 220D. For example, the mode register 320 may output a logical high signal as a control signal to the burst indicator generator 220D based on data stored in the mode register 320.

Data stored in the mode register 320 may indicate an operational mode that the semiconductor memory device 100 is to operate in. The mode register 320 may be one of multiple mode registers 320 used to program operations of the semiconductor memory device 100. Data may be written to the mode register 320 to turn on the burst indicator generator 220D. The burst indicator generator 220D may be turned on as part of a larger operation used to operate the semiconductor memory device 100 in the training mode (e.g., into the training mode from a normal mode), and it should be understood that other operations may use any of the burst indicator generators 220 including but not limited to operating the semiconductor memory device 100 into the training mode. In some cases, the mode register 320 may be a public function so that functions executed outside of the memory controller 322, such as functions executed on a host device, may access the mode register 320 and thus cause the burst indicator generator 220D to turn on.

A memory controller 322 may determine to enter a testing mode (e.g., testing operational mode). While in the testing mode, the memory controller 322 may generate and send training commands to the C/A decoder 222. However, while not in the testing mode and while in a normal mode (e.g., normal operational mode), the memory controller 322 may send normal read commands, write commands, refresh commands, and the like to the C/A decoder 222.

In response to determining to enter the testing mode, the memory controller 322 may transmit write data to the mode register 320 (e.g., "1"). The mode register 320 may include one or more normal mode registers 321 (normal mode register 312A, normal mode register 312B, normal mode register 312C . . . normal mode register 312N) and one or more test mode registers 323 (test mode register 323A, test mode register 323B, test mode register 323C . . . test mode register 323N). The normal mode registers 321 may be accessible by any external systems and/or internal systems of the semiconductor memory device 100 and may be standardized by an industry specification for consistent methods of access any of the external and/or internal systems. The test mode registers 323 may be accessible to internal systems of the memory device and may be inaccessible by the external systems couple to the semiconductor memory device 100. Both the normal mode registers 321 and the test mode registers 323 may be programmed through a Mode Register Set command (MRW). Test mode registers 323 may be used by a manufacturer of the semiconductor memory device 100 to control and/or trim special hardware configurations, which are not expected to grant the external system access to.

The mode register 320 may output a logic high signal as the enable signal 278 to the burst indicator generator 220D based on data stored in the normal mode registers 321 and/or the test mode registers 323, and the burst indicator generator 220D may turn on in response to the enable signal 278. It is noted that in some cases, an external system may write data to the mode register 320 to turn on the burst indicator generator 220D. Furthermore, in some embodiments, the mode register 320 may output a control signal having a particular voltage level used to activate (e.g., turn on) the burst indicator generator 220D that may be greater than or less than a system logic high voltage level or a system logic low voltage level. In some cases, a logic low signal may be transmitted as a control signal to turn on the burst indicator generator 220D.

Figure 13:
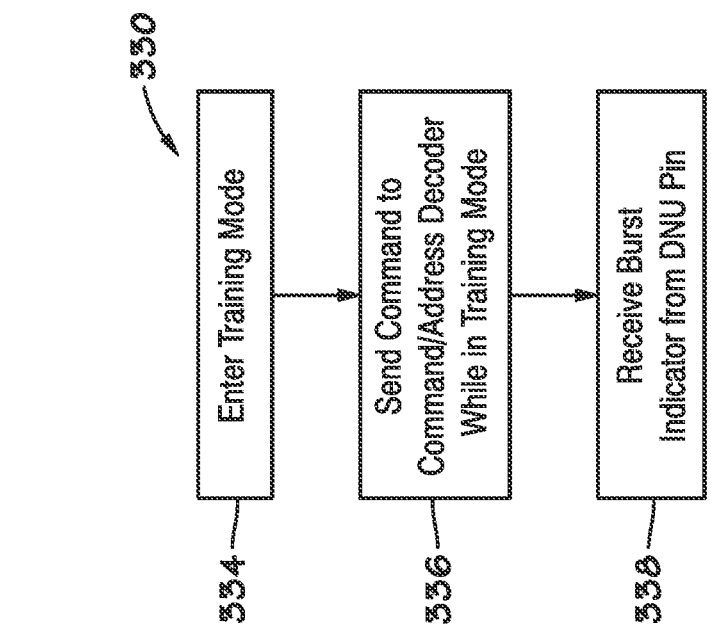
FIG. 13 is a flowchart of a process to enable the burst indicator generator of FIG. 3, in accordance with an embodiment of the present disclosure.

Keeping the foregoing in mind, FIG. 13 is a flowchart of a process 330 to cause the semiconductor memory device to enter a training mode at least in part by enabling the burst indicator generator 220. Indeed, the process 330 may include operating a semiconductor memory device (or a portion of the memory device) to enter a training mode (block 334), sending a command to a command/address decoder while the semiconductor memory device is in the training mode (block 336) (where the command/address decoder may generate a command/address waveform in response to the command), and receiving a burst indicator waveform generated by a burst indicator generator of the semiconductor memory device (block 338), where the burst indicator waveform may generated based on the command/address waveform of block 336. Although described herein as performed by the memory controller 322, it should be understood that the process 330 may be executed by a processor or controller of a computing device in which the semiconductor memory device 100 of FIG. 1 is operating. For example, the process 330 may be performed by a host device external to the semiconductor memory device 100 of FIG. 1, such as an external controller. It should be understood that, while operations of the process 330 are shown in a specific order, the operations may be implemented in any suitable order, and at least some of the operations may be skipped altogether. In some cases, the process 330 may be wholly or partially performed by test equipment such as automated test equipment (ATE) and/or an oscilloscope.

At block 334, the memory controller 322 may determine to enter a training mode and may operate one or more portions of the semiconductor memory device 100 into the training mode via an enable signal 278. While in the training mode, the memory controller 322 may generate training commands (e.g., MPC-RD FIFO, MPC-WR FIFO, MPC-RD, MPC-WR, commands with 3rd bit=0 as in Table 2). During the training mode, the memory controller 322 may not service normal access request to help reduce a likelihood of a function errors from occurring during the training. To enter the training mode, the memory controller 322 may turn on the burst indicator generator 220 via one of several methods, for example, a reserved pin of the semiconductor memory device 100 may be coupled to a voltage source 282 to turn on the burst indicator generator 220A. The memory controller 322 may operate a switch to couple the DNU pin 280 of FIG. 8 to the voltage source 282 and/or or an external actor (e.g., system, operator) may directly the DNU pin 280 of FIG. 8 (e.g., a second reserved pin) to the voltage source 282, either of which may generate the enable signal 278 to turn on the burst indicator generator 220A. To generate the enable signal 278 to turn on a burst indicator generator 220B, the memory controller 322 and/or or an external actor (e.g., system, operator) may operate a switch to couple and/or may directly couple the DNU pin 230 (e.g., a first reserved pin) to the voltage source 282, such as through the resistor 279. To generate the enable signal 278 to turn on the burst indicator generator 220C, the memory controller 322 may operate a switch to couple or an external actor (e.g., system, operator) may directly couple the IO pad 303 (e.g., a first reserved pin) to the voltage source 282 via the resistor 279. Moreover, to generate the enable signal 278 to turn on the burst indicator generator 220D, the memory controller 322 may write one or more data signals (e.g., binary data indicative of the training mode) to the mode register 320, which may output the enable signal 278 to the burst indicator generator 220D to turn on the burst indicator generator 220D. In another case, the burst indicator generator 220 may directly receive the enable signal 278 from the memory controller 322 and turn on in response to receiving the enable signal 278. With any of these systems and methods, selectively turning on the burst indicator generator 220 for the training mode but turning it off for a normal mode may reduce power consumed by the semiconductor memory device 100 over time relative to power consumed by the burst indicator generator 220 if left on during the normal mode.

While in the training mode, at block 336, the memory controller 322 may send a command to the C/A decoder 222. The C/A decoder 222 may output command/address waveforms via the bus 224 to peripheral and array circuitry 226 and to the burst indicator generator 220. In response to receiving the command/address waveforms, the burst indicator generator 220 may generate the burst indicator waveform 250. In some cases, the memory controller 322 may, at block 338, receive the burst indicator waveform 250 from the DNU pin 230 and perform processing operations on the burst indicator waveform 250.

In some cases, an oscilloscope, as opposed to the memory controller 322, may sense the burst indicator waveform 250 from the DNU pin 230 and may perform processing operations on the burst indicator waveform 250. A processor of the oscilloscope may use a filter function to isolate waveforms of interests based on one or more parameters. For example, in case 1 of FIG. 1, normal DQ bursts 248 from two ranks were mixed. Typically, two ranks are implemented in two separate memory die, and thus two indicator waveforms may be output respectively from two DNU pins. Therefore, to filter out the DQ bursts 248 of the rank of interest, the indicator waveform may be measured via the corresponding DNU pin of the rank of interest. However, if the two ranks are implemented in a single memory die, and thus read out via a single DNU pin, encoding operations of the burst indicator generator 220 may distinguish between and indicate the DQ bursts 248 for each rank respectively. Additionally, in case 2 of FIG. 1, the waveforms of interest may be the one or more DQ bursts 248 corresponding to normal commands, which may be filtered based on a removal of the DQ bursts 248 corresponding to the training commands. Thus, improving operations to remove the DQ bursts 248 corresponding to the training commands may improve validation operations by improving accuracy of the filtering of DQ bursts 248 corresponding to the normal commands. A processor of the oscilloscope may filter the DQ burst 248 based on one or more intersecting filter ranges. For example a "Must Intersect" filter may be used to require that a bust indicator waveform to be identified crosses a low voltage range and a "Must Not Intersect" filter may be used to require that the same burst indicator waveform must not cross a high voltage range. The filter ranges may help identify the burst indicator waveform 250 from one or more additional signals sensed by the oscilloscope, which may enable detection of the burst indicator waveform 250. A processor of the oscilloscope may filter out DQ/DQS waveforms of interests based on the isolated the burst indicator waveform 250. Furthermore, timing validation operations may be made based on the timing of the DQ bursts 248 and/or the DQS bursts 246 after being filtered. The processor may communicate the timing differences to processing circuitry and/or the memory controller 322 to compensate for the timing differences.

Figure 14:
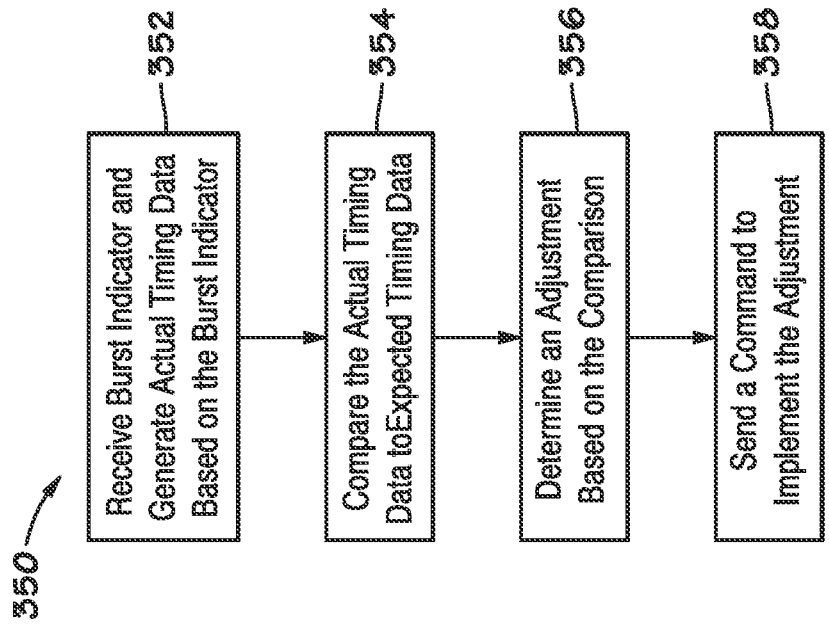
FIG. 14 is a flowchart of a process to adjust operation of the semiconductor memory device of FIG. 1 based on timing differences determined using the burst indicator waveform of FIG. 4, in accordance with an embodiment of the present disclosure.

Regardless of which processing circuitry (e.g., memory controller 322 or oscilloscope processor) receives the burst indicator waveform 250, the burst indicator waveform 250 may be processed automatically by the processing circuitry. Keeping this in mind, FIG. 14 is a block diagram of a flowchart of a process 350 for processing the burst indicator waveform 250. Indeed, the process 350 may include generating timing data based on a burst indicator waveform and a DQ signal (block 352), such as based on the burst indicator waveform generated by operations of process 330, comparing timing data to expected timing data (block 354), determining an adjustment based on the comparison of the timing data to the expected timing data (block 356), and sending a control signal to implement the adjustment (block 358). Although described herein as performed by the memory controller 322, it should be understood that some or all of the process 350 may be executed by a processor or controller of a computing device in which the semiconductor memory device 100 of FIG. 1 is operating. For example, the process 350 may be performed by a host device external to the semiconductor memory device 100 of FIG. 1, such as an external controller. It should be understood that, while operations of the process 350 are shown in a specific sequence, the operations may be implemented in any suitable order, and at least some of the operations may be skipped altogether. In some cases, the process 350 may be wholly or partially performed by test equipment such as automated test equipment (ATE) and/or an oscilloscope. For example, operations of blocks 352, 354, and/or 356 may be performed by processing circuitry of the oscilloscope and the memory controller 322 may perform operations of block 356 and/or 358.

At block 352, the memory controller 322 may receive the burst indicator waveform 250 from the DNU pin 230 and may generate actual timing data of corresponding DQ signals based on the burst indicator waveform 250. The actual timing data may indicate timing of an eye diagram of the corresponding DQ signal and/or DQS signal filtered based on the burst indicator waveform 250. The burst indicator waveform 250 output via the DNU pin 230 may be filtered such that only the bursts corresponding to training commands (e.g., bursts corresponding to MPC-RD FIFO, MPC-WR FIFO, bursts corresponding to a constant "0" level) are output via the DNU pin 230, thereby meaning that the DQ signal filtered from the data output via the bus 288 corresponds just to the burst indicator waveform 250.

At block 354, the memory controller 322 may compare the actual timing data to expected timing data of the DQ signal (e.g., DQ eye diagram). The expected timing data may be a stored indication of target timing that the semiconductor memory device 100 is desired to operate according to. The memory controller 322 may, at block 356, determine an adjustment to apply to the semiconductor memory device 100 to correct a difference between the actual timing data and the expected timing data. In some cases, the memory controller 322 may also compare the difference to a threshold, such that adjustments are made in response to the difference being greater than or equal to, or crossing, the threshold amount. At block 358, the memory controller 322 may send one or more commands to one or more components of the semiconductor memory device 100 and/or a host device of the semiconductor memory device 100 to implement the adjustment.

Keeping the foregoing in mind, there may be added benefit from the burst indicator generator 220 encoding the burst indicator waveform 250 as opposed to using constant values, such as if the memory controller, the host device (e.g., system that includes or communicates with the semiconductor memory device 100), or the like, would like to track which DQ bursts 248 correspond to which commands transmitted via C/A bus 110. For example, during a validation operation, there may be write bursts and read bursts that are challenging to distinguish on the oscilloscope. Using the burst indicator waveform 250 as both the indicator of the type of the data-related command, as well as the indicator of the timing of the data-related command, may reduce a number of readouts dedicated to reading this data by consolidating the outputs into one symbol while also improving validation operations, such as those performed based on an oscilloscope sensor. By measuring the special pattern encoded into the burst indicator waveform 250, a type of burst may be matched to a type of command. By detecting the special pattern, processing circuitry and/or the memory controller 322 may determine whether the burst corresponds to a normal command or to a training command. With this, two or more different types of data bursts may be distinguishable by the processing circuitry.

The semiconductor memory device may include a command/address bus (e.g., C/A bus 110), a decoder (e.g., C/A decoder 222) communicatively coupled to a memory controller (e.g., memory controller 322) via the command/address bus, and a burst indicator generator (e.g., burst indicator generator 220). The decoder may generate a command/address waveform (e.g., command burst 242) in response to a command signal from the memory controller, and the burst indicator generator may receive the command/address waveform and generate a burst indicator waveform (e.g., burst indicator waveform 250) based on the command/address waveform. The burst indicator waveform may be transmitted via a first reserved pin (e.g., DNU pin 230, IO pad 303). The memory controller may operate the semiconductor memory device to enter a training mode at least in part by operating the burst indicator generator to turn on and by sending a training command to the command/address decoder while the semiconductor memory device is in the training mode. The command/address decoder may generate the command/address waveform in response to the training command.

Systems and methods described herein may be used to generate a burst indicator (e.g., burst indicator waveform) that may filter target data from noisy data signals transmitted via a DQ bus. Improving filtering of target data may improve sampling operations by enabling sampling in more circumstances, such as when data signals are noisy from overlapping normal operations and testing operations and/or from multiple ranks of a memory. Improving the sampling operations may reduce an amount of processing resources used to determine which of the data signals to sample for validation, which may further reduce power consumption or enable more efficient allocation of computing resources. Furthermore, a burst indicator generator may be used to generate the burst indicator. The burst indicator generator may be turned off when idle and/or when the memory system is not in a training mode, which may reduce power consumed by the memory. The burst indicator generator may be turned on and, while turned on, may generate the burst indicator based on received C/A signals. Generation of the burst indicator may be used to improve filtering of target data, which may improve sampling operations by enabling sampling in more circumstances, such as when data signals are noisy from overlapping normal operations and testing operations and/or from multiple ranks of a memory. Sampling operations may be performed during a training mode of the memory system and other operational applications may benefit from the burst indicator. Indeed, the burst indicator generator presents a practical solution able to be implemented without assistance from a system that includes the semiconductor memory device, without assistance from a customer, and/or without making changes to system configuration or behavior, meaning that the validation operations may be performed under real usages and loads. The burst indicator generator may use 1 or 2 DNU pins, or a mode register, when being turned on and/or to output the burst indicator, and thus may be compatible with industry specifications. Furthermore, the burst indicator waveform generated by the burst indicator generator may provide a way to distinguish between various bursts corresponding to different commands (e.g., RD, WR, MRR, MRW, MPC-FIFO), which may make debug and measurement tasks less complex for processing circuitry to perform and more accurate by reducing noise in measured samples.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform] ing [a function] . . . " or "step for [perform]ing [a function] . . . ", it is intended that such elements are to be interpreted under 35 U.S.C. 112 (f). However, for any claims containing elements designated in any other manner, it is intended that such elements are not to be interpreted under 35 U.S.C. 112 (f).

What is claimed is:

1. A system, comprising:
 a system-on-a-chip;
 an interposer comprising a first via;
 a test pad disposed on the interposer; and
 a semiconductor memory device disposed on the interposer and adjacent to the test pad, wherein the semiconductor memory device is communicatively coupled to the system-on-a-chip via a first reserved pin through the first via, and wherein the semiconductor memory device comprises:
  a command/address decoder; and
  a burst indicator generator configured to:
   receive a command/address waveform from the command/address decoder;
   generate a burst indicator waveform based on the command/address waveform, wherein the burst indicator waveform changes logical state in response to a first edge of the command/address waveform and a final edge of the command/address waveform; and
   transmit the burst indicator waveform to the system-on-a-chip via the first reserved pin through the first via.

2. The system of claim 1, comprising a second reserved pin, wherein the burst indicator generator is configured to generate the burst indicator waveform while the second reserved pin is coupled to a voltage source to turn on the burst indicator generator.

3. The system of claim 1, wherein the burst indicator generator is configured to generate the burst indicator waveform while the first reserved pin of the semiconductor memory device is coupled to a voltage source to turn on the burst indicator generator.

4. The system of claim 1, comprising a memory controller configured to send a command to the command/address decoder, wherein the command/address decoder is configured to generate the command/address waveform based on the command.

5. The system of claim 4, wherein the semiconductor memory device comprises peripheral and array circuitry configured to store first data, and wherein the peripheral and array circuitry is communicatively coupled to the command/address decoder and the burst indicator generator through a same bus.

6. The system of claim 5, wherein the command/address waveform is configured to cause the peripheral and array circuitry to output the first data.

7. The system of claim 4, wherein the burst indicator generator is configured to generate the burst indicator waveform while turned on, and wherein the burst indicator generator turns on in response to receiving an enable signal generated at least in part by the memory controller.

8. The system of claim 7, wherein the semiconductor memory device comprises a mode register that outputs the enable signal to the burst indicator generator after being loaded with data by the memory controller.

9. The system of claim 8, wherein the memory controller is configured to:
 operate the semiconductor memory device to enter a training mode at least in part by turning on the burst indicator generator; and
 send a training command to the command/address decoder while the semiconductor memory device is in the training mode, wherein the command/address decoder is configured to generate the command/address waveform in response to the training command.

10. A semiconductor memory device, comprising:
a command/address bus;
a decoder communicatively coupled to a memory controller via the command/address bus; and
a burst indicator generator configured to receive a command/address waveform generated by the decoder in response to a command signal from the memory controller and generate a burst indicator waveform that changes logical state in response to a first edge of the command/address waveform and a final edge of the command/address waveform, wherein the burst indicator generator transmits the burst indicator waveform via a first reserved pin.

11. The semiconductor memory device of claim 10, comprising peripheral and array circuitry configured to store first data, wherein the command/address waveform is configured to cause the peripheral and array circuitry to output the first data, and wherein the first data is associated with the command signal.

12. The semiconductor memory device of claim 10, comprising a second reserved pin, wherein the burst indicator generator is configured to generate the burst indicator waveform while the second reserved pin is coupled to a voltage source to turn on the burst indicator generator.

13. The semiconductor memory device of claim 10, wherein the burst indicator generator is configured to generate the burst indicator waveform in response to the first reserved pin being coupled to a voltage source to turn on the burst indicator generator.

14. The semiconductor memory device of claim 10, wherein the burst indicator generator is configured to generate the burst indicator waveform, and wherein the burst indicator generator turns on in response to receiving a data signal from a mode register.

15. A method, comprising:
operating a semiconductor memory device to enter a training mode;
sending a command to a command/address decoder while the semiconductor memory device is in the training mode, wherein the command/address decoder is configured to generate a command/address waveform in response to the command; and
receiving a burst indicator waveform via a first reserved pin of the semiconductor memory device, wherein the burst indicator waveform is generated by a burst indicator generator of the semiconductor memory device and changes logical state in response to a first edge of the command/address waveform and a final edge of the command/address waveform.

16. The method of claim 15, wherein operating the semiconductor memory device to enter the training mode comprises coupling a second reserved pin of the semiconductor memory device to a voltage source to turn on the burst indicator generator.

17. The method of claim 15, wherein operating the semiconductor memory device to enter the training mode comprises coupling the first reserved pin of the semiconductor memory device to a voltage source to turn on the burst indicator generator.

18. The method of claim 15, wherein operating the semiconductor memory device to enter the training mode comprises writing a data signal to a mode register to turn on the burst indicator generator.

19. The method of claim 15, wherein operating the semiconductor memory device to enter the training mode comprises directly writing a data signal to the burst indicator generator to turn on the burst indicator generator.

20. The method of claim 15, comprising:
generating timing data based on the burst indicator waveform and a data (DQ) signal;
comparing the timing data to expected timing data;
determining an adjustment based on the comparison of the timing data to the expected timing data; and
sending a control signal to implement the adjustment.

* * * * *